US012733109B2

(12) United States Patent
Rathburn

(10) Patent No.: US 12,733,109 B2
(45) Date of Patent: Sep. 8, 2026

(54) ELECTRICAL INTERCONNECT STRUCTURE WITH CIRCUIT BEARING DIELECTRIC LAYERS AND RESULTANT DIELECTRIC SPACING CONTROL AND CIRCUIT PITCH REDUCTION

(71) Applicant: LCP Medical Technologies, LLC, Rogers, MN (US)

(72) Inventor: James Rathburn, Rogers, MN (US)

( * ) Notice: Subject to any disclaimer, the term of this patent is extended or adjusted under 35 U.S.C. 154(b) by 372 days.

(21) Appl. No.: 18/537,621

(22) Filed: Dec. 12, 2023

(65) Prior Publication Data

US 2024/0196542 A1 Jun. 13, 2024

Related U.S. Application Data

(60) Provisional application No. 63/387,016, filed on Dec. 12, 2022.

(51) Int. Cl.

| | |
|---|---|
| ***H05K 3/10*** | (2006.01) |
| ***H05K 3/00*** | (2006.01) |
| ***H05K 3/18*** | (2006.01) |
| ***H05K 3/40*** | (2006.01) |
| ***H05K 3/42*** | (2006.01) |
| ***H05K 3/46*** | (2006.01) |

(52) U.S. Cl.

CPC ........... *H05K 3/107* (2013.01); *H05K 3/0032* (2013.01); *H05K 3/18* (2013.01); *H05K 3/40* (2013.01); *H05K 3/42* (2013.01); *H05K 3/429* (2013.01); *H05K 3/4614* (2013.01); *H05K 3/4623* (2013.01); *H05K 3/4611* (2013.01); *H05K 3/465* (2013.01); *H05K 2201/0141* (2013.01); *H05K 2201/095* (2013.01); *H05K 2201/09563* (2013.01); *H05K 2201/0959* (2013.01); *H05K 2203/0723* (2013.01)

(58) Field of Classification Search

None

See application file for complete search history.

(56) References Cited

U.S. PATENT DOCUMENTS

2016/0212862 A1* 7/2016 Rathburn ............. H05K 3/4623
2019/0014667 A1* 1/2019 Bahl ....................... H05K 3/429
2023/0085035 A1* 3/2023 Ifis ....................... H05K 3/0038
174/262

* cited by examiner

*Primary Examiner* — Jiong-Ping Lu
(74) *Attorney, Agent, or Firm* — Carlson, Caspers, Vandenburgh & Lindquist, P.A.

(57) ABSTRACT

Embodiments for a method of fabricating a printed circuit board are disclosed. A layer of liquid crystal polymer (LCP) having a first layer of copper on a first side thereof and a second layer of copper on a second side thereof is provided. The second layer of copper is 5 microns or less thick. The method includes disposing a resist overtop of the second copper layer and masking the resist to expose the second copper layer at circuit trace locations. Chemical etching is performed to remove the second copper layer that is exposed by the resist, thereby exposing the layer of LCP at certain locations. Laser ablating is also performed to form recesses in the layer of LCP at the certain locations. Copper is disposed in the recesses to form traces that are at least partially embedded in the layer of LCP.

23 Claims, 23 Drawing Sheets

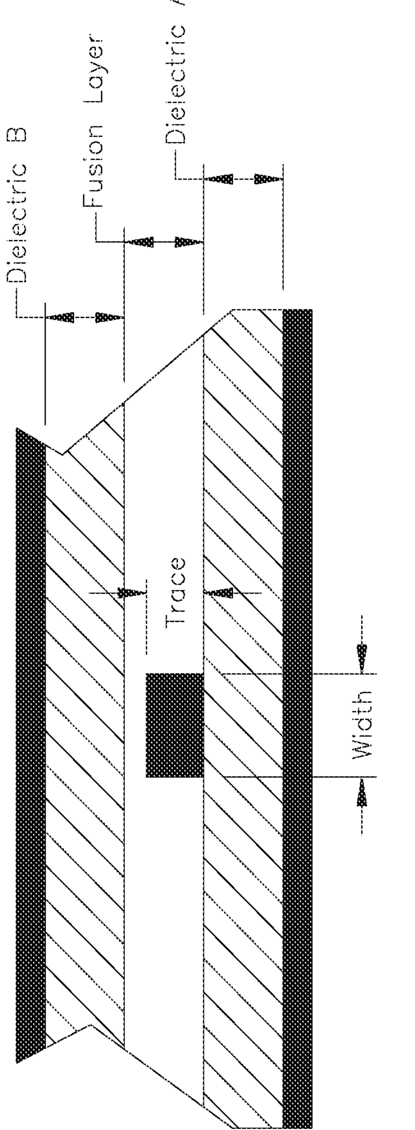
FIG. 1 - Prior Art
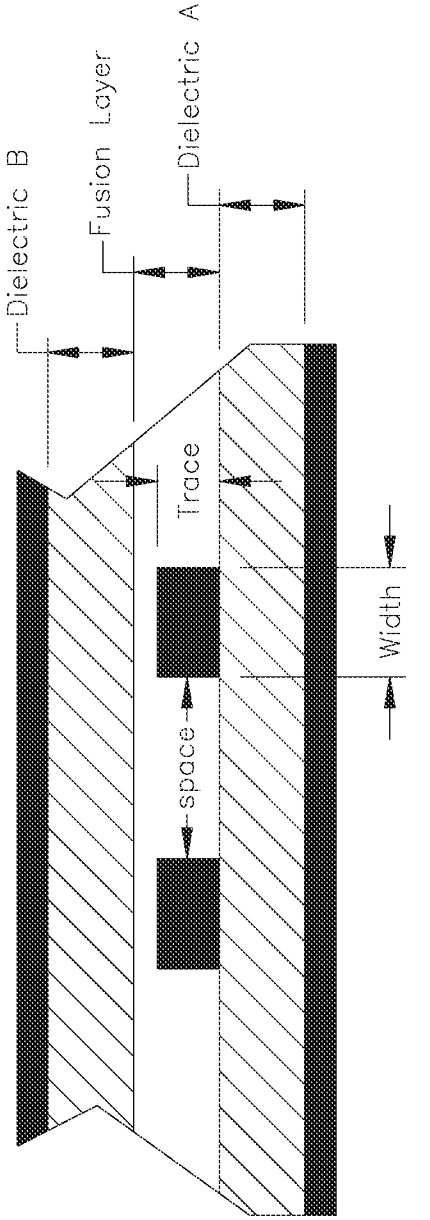
FIG. 2 - Prior Art

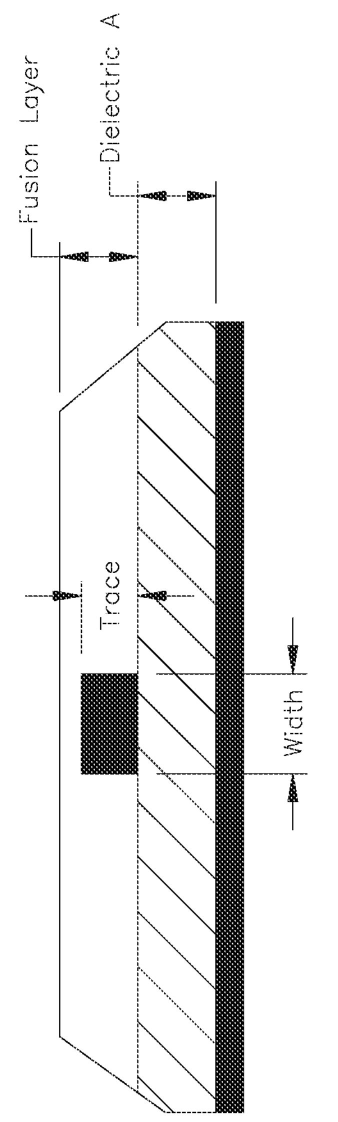
FIG. 3 - Prior Art
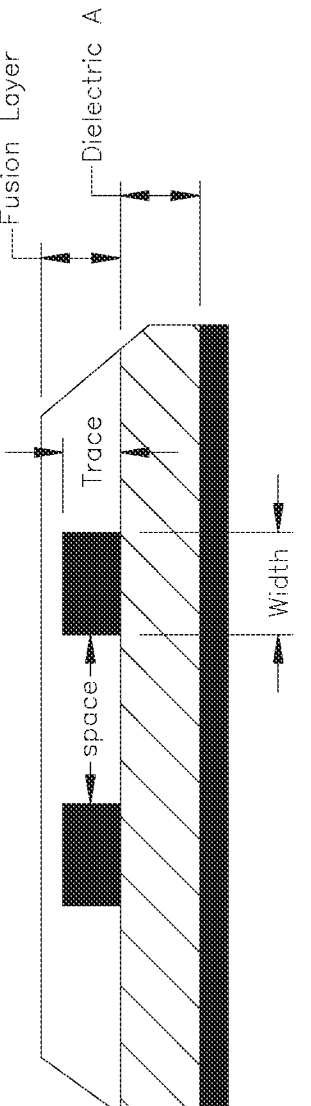
FIG. 4 - Prior Art

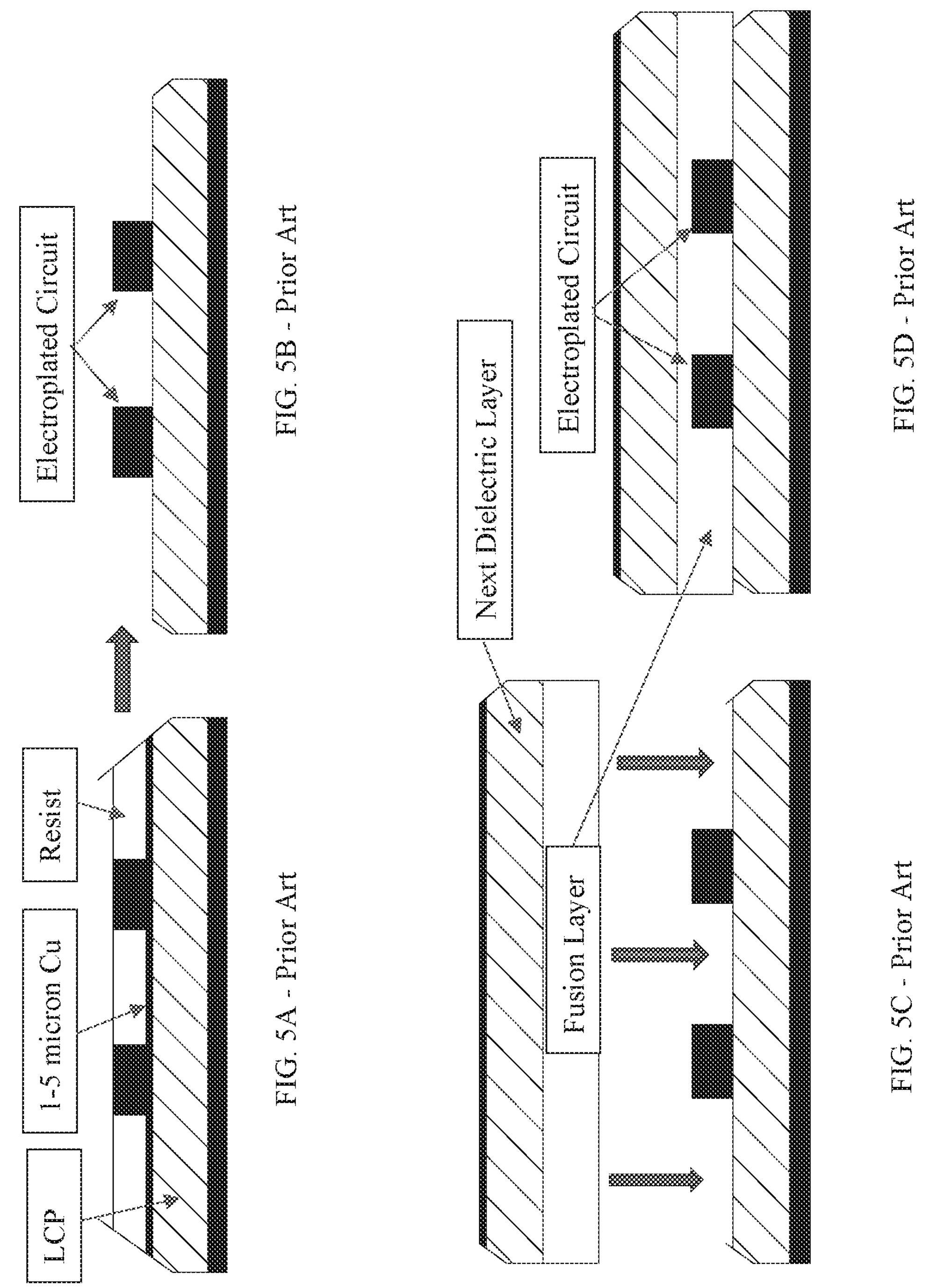
FIG. 5A - Prior Art
FIG. 5B - Prior Art
FIG. 5C - Prior Art
FIG. 5D - Prior Art

FIG. 6 - Prior Art

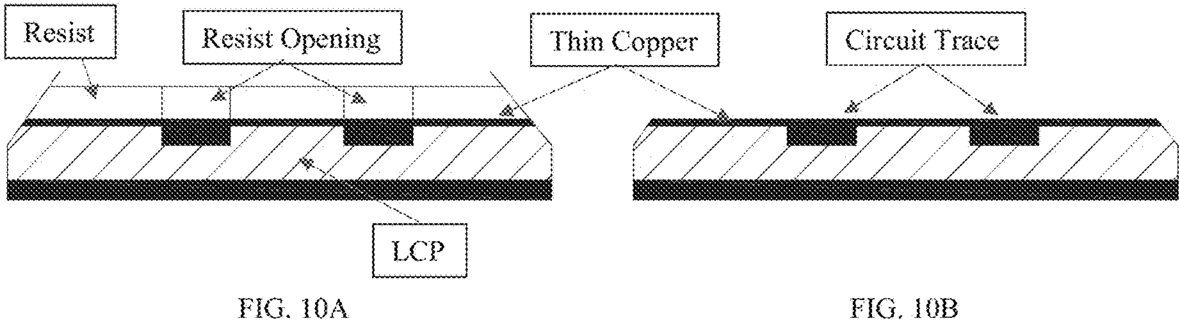
FIG. 10A
FIG. 10B
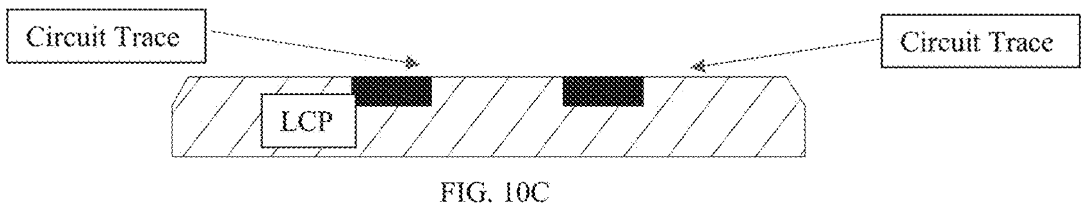
FIG. 10C

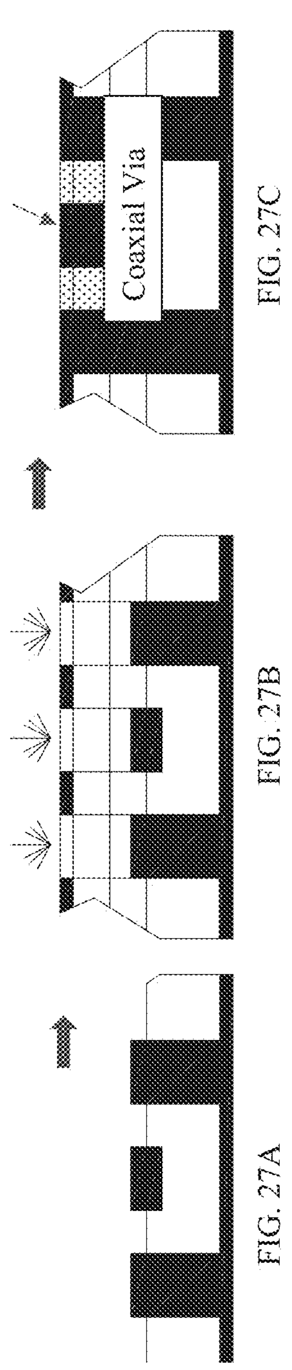
FIG. 27A
FIG. 27B
FIG. 27C
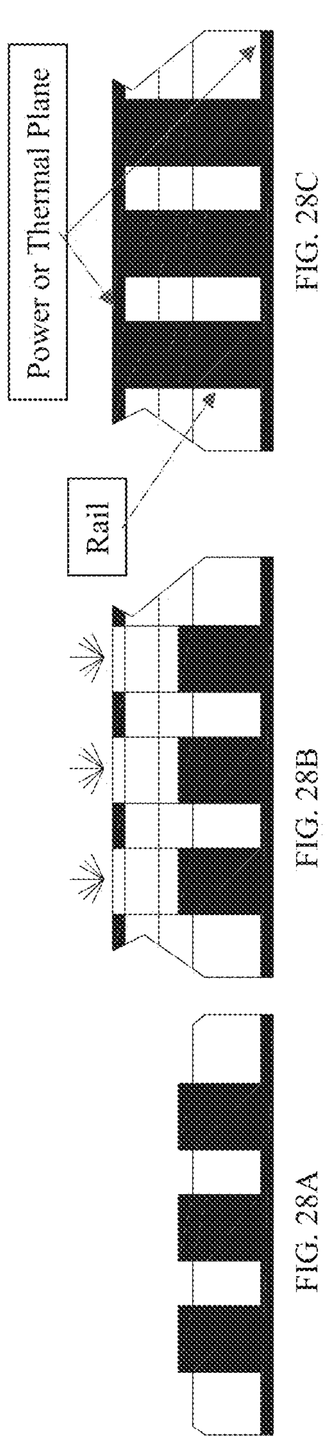
FIG. 28A
FIG. 28B
FIG. 28C

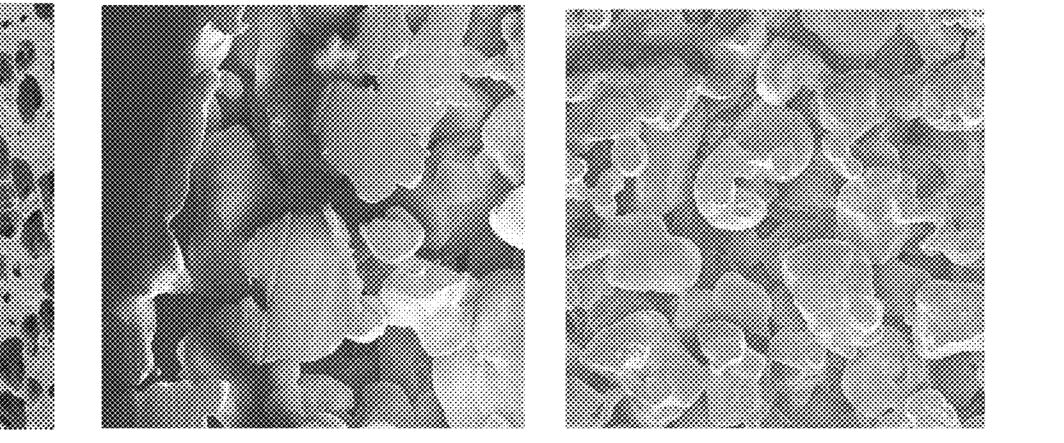
FIG. 31A
FIG. 31B
FIG. 31C
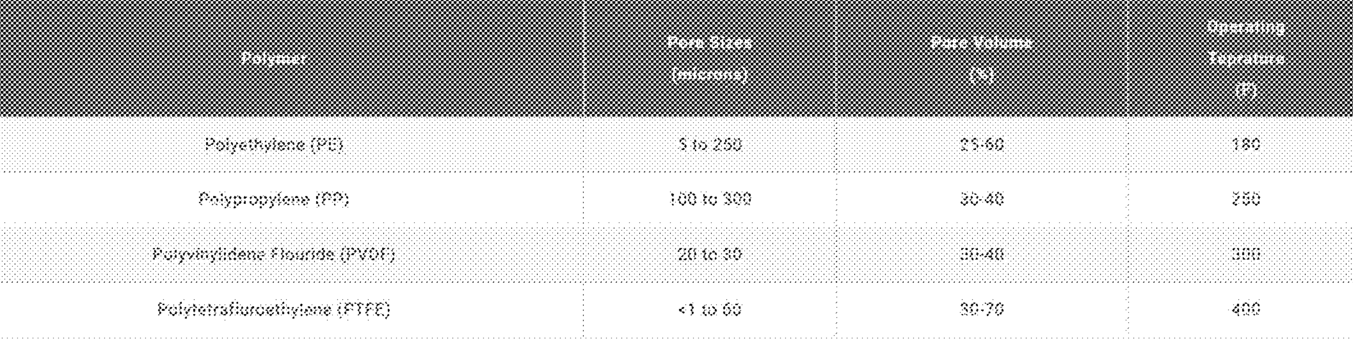
| Polymer | Pore Sizes (microns) | Pore Volume (%) | Operating Teprature (F) |
| --- | --- | --- | --- |
| Polyethylene (PE) | 5 to 250 | 25-60 | 180 |
| Polypropylene (PP) | 100 to 300 | 30-40 | 250 |
| Polyvinylidene Flouride (PVDF) | 20 to 30 | 30-40 | 300 |
| Polytetrafluroethylene (PTFE) | <1 to 60 | 30-70 | 400 |
FIG. 32

FIG. 33A
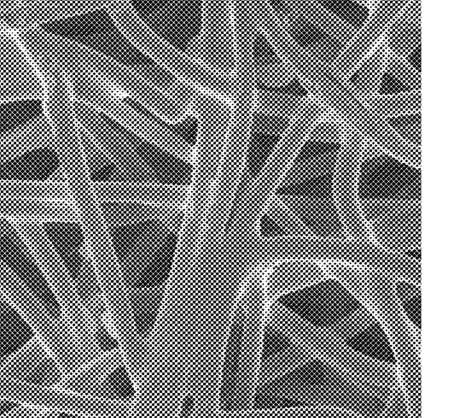
FIG. 33B
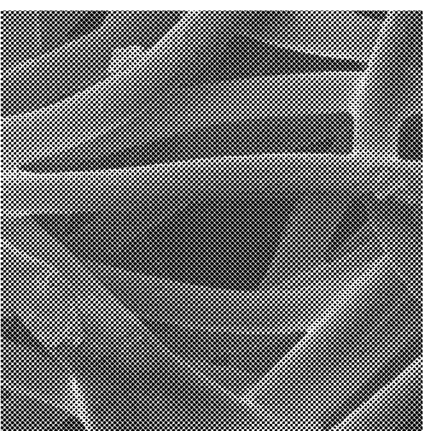
FIG. 33C
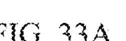
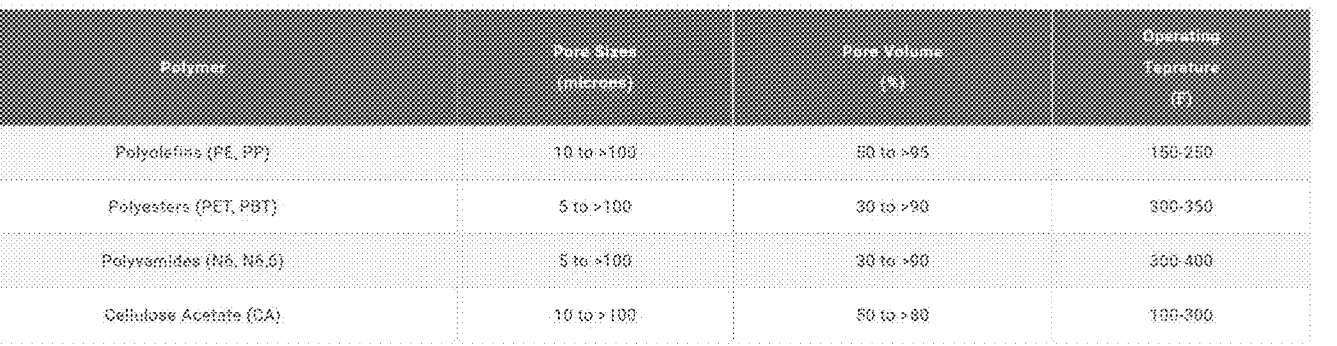
| Polymer | Pore Sizes (microns) | Pore Volume (%) | Operating Teprature (F) |
|---|---|---|---|
| Polyolefins (PE, PP) | 10 to >100 | 50 to >95 | 150-250 |
| Polyesters (PET, PBT) | 5 to >100 | 30 to >90 | 300-350 |
| Polyvamides (N6, N6,6) | 5 to >100 | 30 to >90 | 300-400 |
| Cellulose Acetate (CA) | 10 to >100 | 50 to >80 | 100-300 |
FIG. 34

Dielectric B
Fusion Layer
Dielectric A

Dielectric B
Fusion Layer
Dielectric A

Dielectric B
Fusion Layer
Dielectric A

Dielectric B
Fusion Layer
Dielectric A

ELECTRICAL INTERCONNECT STRUCTURE WITH CIRCUIT BEARING DIELECTRIC LAYERS AND RESULTANT DIELECTRIC SPACING CONTROL AND CIRCUIT PITCH REDUCTION

RELATED APPLICATIONS

This application claims the benefit of U.S. Provisional Application No. 63/387,016, filed on Dec. 12, 2022, and entitled "Electrical Interconnect Structure with Circuit Bearing Dielectric Layers and Resultant Dielectric Spacing Control and Circuit Pitch Reduction", which is hereby incorporated herein by reference.

BACKGROUND

Traditional printed circuits are often constructed in what is commonly called rigid or flexible formats. The rigid versions are used in nearly every electronic system, where the printed circuit board (PCB) is essentially a laminate of materials and circuits that when built is relatively stiff or rigid and cannot be bent significantly without damage. Flexible circuits have become very popular in many applications where the ability to bend the circuit to connect one member of a system to another has some benefit. These flexible circuits are made in a very similar fashion as rigid PCBs, where layers of circuitry and dielectric are laminated. The main difference is the material set used for construction. Typical flexible circuits start with a polymer film that is clad, laminated, or deposited with copper. A photolithography image with the desired circuitry geometry is printed onto the copper, and the film is etched to remove the unwanted materials. The films are processed similarly to that of rigid PCBs with a series of imaging, masking, drilling, via creation, plating, trimming etc. The resulting circuit is flexible in such a way that as it is bent, the polymer film bends and supports the copper circuitry in a way that it does not crack or break. These circuits are solderable and can have devices attached to provide some desired function. They are very commonly used in many electronic systems such as notebook computers, medical devices, displays, handheld devices, autos, aircraft and many others. These flexible materials can be used in high-frequency applications where the material set and design features can often provide better electrical performance than a comparable rigid circuit. These circuits are connected to the system in a variety of ways. In most cases, a portion of the circuitry is exposed to create a connection point in terminal. Once exposed, the terminal can be connected to another circuit or component by soldering, conductive adhesive, thermos-sonic welding, pressure or some sort of connector. In general, the terminals are located on an end of the circuit, where edge traces are exposed or in some cases an area array of terminals are exposed. Often there is some sort of mechanical enhancement at or near the connection to prevent the joints from being disconnected during use or flexure. Rigid printed circuits are the backbone of all electronic systems, with many devices soldered to terminals on the PCB.

BRIEF DESCRIPTION

Embodiments for a method of fabricating a printed circuit board are disclosed. A layer of liquid crystal polymer (LCP) having a first layer of copper on a first side thereof and a second layer of copper on a second side thereof is provided. The second layer of copper is 5 microns or less thick. The method includes disposing a resist overtop of the second copper layer and masking the resist to expose the second copper layer at circuit trace locations. Chemical etching is performed to remove the second copper layer that is exposed by the resist, thereby exposing the layer of LCP at certain locations. Laser ablating is also performed to form recesses in the layer of LCP at the certain locations. Copper is disposed in the recesses to form traces that are at least partially embedded in the layer of LCP.

BRIEF DESCRIPTION OF DRAWINGS

Understanding that the drawings depict only exemplary embodiments and are not therefore to be considered limiting in scope, the exemplary embodiments will be described with additional specificity and detail through the use of the accompanying drawings, in which:

FIG. 1 is a cross-sectional view of an example circuit stack having a construction referred to herein as "single ended stripline";

FIG. 2 is a cross-sectional view of an example circuit stack having a construction referred to herein as "double ended stripline";

FIGS. 3 and 4 are cross-sectional views of other example circuit stacks having the "single ended stripline" and "differential stripline" construction, but without an upper copper reference plane;

FIGS. 5A-5D are cross-sectional views of an example stages of a circuit stack having a dielectric layer (LCP) with a very thin layer of copper (1-5 micron Cu) such as 1 to 5 microns thick;

FIG. 6 is a cross-sectional view a circuit stack having a core dielectric layer with circuits on both sides;

FIGS. 10A-10C are cross-sectional views of example stages of a circuit stack in the new processes;

FIGS. 27A-27C are cross-sectional views of an example stages of a circuit stack illustrating the construction of coaxial vias;

FIGS. 28A-28C are cross-sectional views of an example circuit stacks illustrating another significant benefit to this aspect, which is the ability to implement vertical circuit walls can allow for vertical power rails, thermal management, and other functions beyond isolation;

FIGS. 31A-31C are magnified images showing the example structure of Porous Liquid Polymer dielectric;

FIG. 32 is a table listing common polymer types used for the sintering production of a porous polymer matrix;

FIGS. 33A-33C are magnified images showing the example structure in which very fine polymer fibers are used, referred to herein as "Porous Fiber" material;

FIG. 34 is a table illustrating example polymer types used for the Porous Fiber material, which are similar to the Sintered Particle porous material;

DETAILED DESCRIPTION

Figures 7, 8A, 8B:
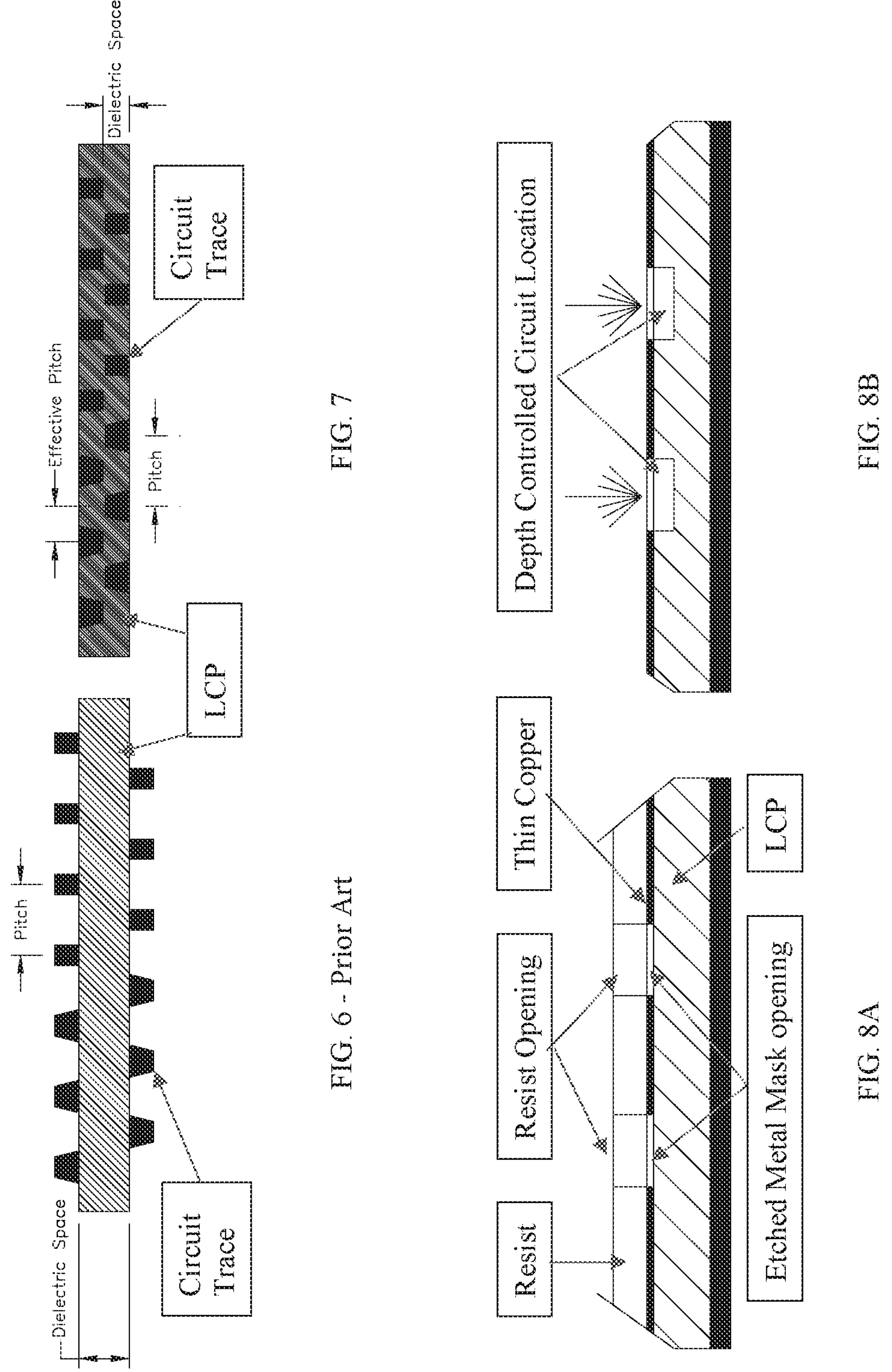
FIG. 7 is a cross-sectional view another circuit stack having a core dielectric layer with circuits on both sides.
FIGS. 8A and 8B are cross-sectional views of an example stages of a circuit stack in a new process.

In general, rigid and flexible circuits fill a needed function within the electronics industry. Flexible circuits can be considered expensive compared to some rigid PCB products. They do have some limitations regarding layer count or feature registration, and they are generally used for small or elongated applications. Rigid PCBs and package substrates experience challenges as the feature sizes and line spacing are reduced to achieve further miniaturization and increased circuit density. The use of laser ablation has become increasingly used to create the via structures for fine line or fine pitch structures. The use of lasers allows localized structure creation, where the processed circuits are plated together to create via connections from one layer to another. As density increases, the laser processed via structures can experience significant taper, carbon contamination, layer-to-layer shorting during the plating process due to registration issues, and high resistance interconnections that may be prone to result in reliability issues. The challenge of making fine line PCBs often relates to the difficulty in creating very small or blind and buried vias.

Embodiments described herein are aimed at all dielectrics such as Polyimide, Modified Polyimide, Low Loss Polyimide, ABF, BT, Epoxy based, FR4, and High-Performance Low Loss Laminates, with an example of liquid crystal polymer (LCP) as a dielectric material to produce high density, higher performance multi-layer electrical circuits capable of directly attaching silicon die and other components on a very fine termination pitch. LCP has been used in applications with a method called lamination bonding where the base LCP material is laminated with sufficient heat and pressure to cause multiple layers of LCP to bond to each other or fuse to resemble a contiguous material set consisting of LCP. The lamination of these structures is controlled such that the material is processed close to melt temperature without escaping into the liquidous phase with loss of definition, material movement, circuit movement and circuit embossing. Several variants of LCP are available with multiple melt temperatures providing some latitude in lamination temperature and pressure ranges. A limitation of this use of LCP is reached when a circuit stack beyond 4 to 5 layers is desired with fine circuit geometry contained within the stack. The sequential lamination required to build multilayer constructions challenges the material set where previously created fusion bond interfaces weaken and embedded circuitry is disrupted. The physical bond of the LCP to LCP can be disrupted, and in general the bond of LCP to copper is inadequate to survive required reliability in many cases resulting in delamination.

Another limitation of traditional printed circuit construction relates to impedance control. Commercially available LCP films are produced in various thicknesses, with 25 micron being the thinnest available. Characteristic Impedance is an electrical property that defines the environment signals travel in the printed circuit, and it is very important to match the target impedance for high-speed signal designs. The dielectric properties of LCP and other materials dictate the physical size of circuit traces and spaces based upon trace thickness and dielectric spacing. With 25 micron LCP as the available limit, a corresponding 50 ohm impedance match requires a trace that is between 40 and 65 microns wide depending on the metal thickness and dielectric spacing. This law of physics establishes the physical limit of circuit density and how small the traces and spaces can be to match impedance, even if the manufacturing process is capable of smaller geometries. Embodiments described herein overcome that limitation by restructuring the circuit pattern such that the effective dielectric thickness is reduced relative to the circuits themselves and position relative to each other. LCP is a preferred material, but other printed circuit type materials can also be used provided they meet the properties and manufacturing needs.

FIG. 1 is a cross-sectional view of an example PCB having a construction referred to herein as "single ended stripline". In single ended stripline the circuit pattern (Trace) is pre-defined on a layer of dielectric that has copper reference planes (Dielectric A and Dielectric B) above and below the circuit traces. The dielectric spacing or separation is defined by the thickness of Dielectric A and Dielectric B plus a percentage of the bond material (Fusion) layer less the circuit (Trace) height. The ratios of these dimensions and the relative dielectric properties of the materials defines the characteristic impedance of the circuit. This environment definition also relates to the thickness of the circuit trace which influences the width of the trace in order to achieve a target impedance. A fundamental limitation of the impedance tuning is the thickness of each dielectric layer which in general does not change during lamination. For example, a 50 ohm impedance target using 25 micron layers of LCP material plus a 25 micron bond layer and a 9 micron thick copper trace results in a trace width of 41 microns wide and separation of 72 microns.

FIG. 2 is a cross-sectional view of another example PCB having a construction referred to herein as "differential stripline". Differential stripline creates a differential impedance match environment. In this environment, the dielectric separation is similar to the single ended stripline wherein at 72 microns the space between 36 micron wide traces is 50 microns.

FIGS. 3 and 4 are cross-sectional views of other example PCBs having the "single ended stripline" and "differential stripline" construction, but without an upper copper reference plane. These constructions are similar to that of FIGS. 1 and 2.

The examples of FIGS. 1-4 are all sensitive to trace thickness. Increasing the trace thickness can reduce the effective line width for the target impedance which plays into the limitations of trace creation. Traditional print and etch limitations reside around 35 to 50 micron wide traces for the best in class, with some advanced processes capable of 25 microns wide in a single layer 9 microns thick. To achieve fine lines and spaces with thicker traces a process called Semi-Additive is often used to electroplate the copper traces thicker to overcome the limits of printing and etching. FIGS. 5A and 5B are cross-sectional views of such a semi-additive process sing the differential microstrip model as an example.

FIG. 5A shows a dielectric layer (LCP) with a very thin layer of copper (1-5 micron Cu) such as 1 to 5 microns thick. A plating resist (Resist) is applied to the thin copper and imaged and developed to define the circuit pattern desired. The thin copper layer is connected to an electrolytic plating bus such that when subjected to the plating chemistry and process the desired circuit pattern grows or is deposited restricted by the resist. When plating is complete the resist is stripped and the circuit subject to etching steps that remove the thin copper between the circuits so the circuits remain intact and proud on the service of the base dielectric. The resulting electroplated circuit is shown in FIG. 5B.

This single layer of circuitry is then further processed as shown in FIGS. 5C and 5D to add additional layers of circuitry as needed to create a larger stack of circuits having electroplated copper vias making vertical connections. FIG. 5C illustrates a second dielectric layer (Next Dielectric Layer), e.g., formed of LCP, being added on top of the electroplated circuit of FIG. 5B. A fusion bond layer (Fusion Layer) is disposed between the second dielectric layer and the first dielectric layer. The second dielectric layer and bond layer are then laminated to the first dielectric layer. The fusion bond layer has a lower melt temperature than the dielectric layer and can be a thermoset or epoxy-based material that can be pre-tacked or partially cured such that is engaged with the dielectric layer to be added but will continue to set and bond to the pre-existing circuit layer upon full lamination pressure and temperature which fully cures the material. In this process step, the fusion layer deforms and slightly flows to all the impressions of the pre-existing circuit layer to become embedded into the fusion layer such that when fully cured the surfaces all bond together. A second thin layer of copper (e.g., 1-5 microns thick) can be disposed on top of the second dielectric layer and the process described with respect to FIGS. 5A and 5B can be repeated to form another circuit layer on this second thin layer of copper. The process of FIGS. 5A-5B can be repeated as desired to form further circuit layers on the stack.

This semi-additive process is very effective and has some limitations when shrinking circuitry smaller while controlling the impedance, size, shape and thickness of the metal circuits and relative dielectric layers. The base dielectric layers are commercially available down to 25 micron thickness, which dictates circuit with and dielectric spacing based upon circuit thickness and final separation after full lamination. Another limitation that can cause process or method issues is the physics of how the fusion layer must adjust itself during the final lamination to accommodate the impression of the circuit layers as the encounter the fusion layer and essentially push the fusion material out of the way which can cause an artifact called circuit embossing which leaves an impression of the circuit traces in the added next dielectric layer.

Embodiments described herein leverage both additive and print-etch processes to achieve the target impedance environments with a smaller effective space and trace ratio relative to the effective dielectric separation while alleviating the potential issue of circuit embossing. In conventional constructions the circuit layer is added to the stack with a supporting dielectric layer relative to the given circuit layer. Whether printed and etched or electroplated the subject circuit layer is relative to one dielectric layer with the circuit proud of the dielectric layer.

Embodiments described herein present the next dielectric layer to be added with pre-defined circuits such that the added dielectric layer is essentially a circuit-bearing dielectric layer that contains the next circuit layers which can in effect reduce the dielectric spacing and allow for a smaller circuit trace to achieve the target impedance. These embodiments utilize the principle of referencing two circuit layers to the same dielectric layer which reduces the effective dielectric separation for a given impedance target while at the same time relaxing print and etch requirements.

Embodiments described herein are aimed at using any dielectric material with an example of a liquid crystal polymer, polyimide or ABF material as a circuit-bearing dielectric material. Most common dielectric materials can be used, of which LCP is an example. The embodiments use a combination of LCP films, dielectric material either in liquid or sheet form, bonding layers that have a lower melt, cure or set temperature than LCP and a series of additive and subtractive steps to create very thin high-performance circuit structures that can replicate or replace conventional technologies as well as provide opportunity for increased circuit density. LCP material has many benefits from an electrical and mechanical standpoint. It has a lower dielectric constant than traditional materials, can be processed to accept direct metal deposition, does not absorb moisture, and has low loss at high frequencies.

Embodiments described herein rely on a base LCP or other dielectric layer with copper clad, deposited or laminated as a starting medium or bare LCP that had preexisting copper removed or in non-metalized form. This LCP can be in film form, injection molded, or compression molded to create a desired thickness or dielectric property. The LCP is processed in such a way to create fine resolution circuit traces by patterning a very thin layer of copper in the 3 to 5 um range with circuits and imaging a plating resist to allow for bulk electroplating of copper restrained by the resist to define the circuit patterns. The resist is stripped away after circuit definition, and the residual plating buss initial very thin copper is etched away while leaving the vast majority of the bulk copper in place. This approach is basically opposite of traditional circuit fabrication, where thick copper is patterned and etched to remove the unwanted copper. Conventional print and etch processes are also claimed and the invention extends the capability of conventional print and etch processing.

These embodiments allow for finer resolution with higher aspect ratio of thickness to width considering circuit separation. The principle starts with a layer of dielectric such as LCP of ABF as examples of the many material types possible, where the desired circuit pattern is created within the dielectric layer on one or both sides by means of embossing, imprinting, chemical removal or laser ablation. For reinforced materials such as FR4, Pre-Preg bond materials or PTFE type materials the circuit impression can be created by mechanical routing or laser ablation. The principle continues with merging pre-defined circuit patterns that correspond to the pre-defined formed features within the dielectric layer, or electroplating the circuit directly with use of catalyst assist or electroless copper deposition.

FIG. 6 is a cross-sectional view a core dielectric layer with circuits on both sides constructed in accordance with an existing process whether print and etch or electroplated. FIG. 7 is a cross-sectional view of a core dielectric layer with circuits both sides constructed in accordance with embodiments of the new processes described herein. The core dielectric layer of FIGS. 6 and 7 have the same dielectric core thickness, but the circuit traces of FIG. 7 are embedded within the dielectric rather than proud of the dielectric layer as shown in FIG. 6. This results in a significant reduction in effective pitch as well as relative dielectric stack thickness.

The embodiment of FIG. 7 is a fundamental building block that creates a platform and principle for creating multi-layer circuits with an effective pitch reduction and dielectric thickness reduction which has many down the process manufacturing and signal performance benefits. Existing methods that create the circuit trace can utilize only the exposed outer upper surface of the dielectric, whereas the embodiments of the new processes described herein can utilize both upper and lower exposed surfaces of the dielectric to effectively reduce the dielectric thickness, or start with a two (2) sided sub-circuit and continue the fabrication with single sided circuit bearing dielectrics. These embodiments create the circuit bearing dielectric layer takes advantage of the dielectric thickness itself to create the circuit in the proper location with a precision controlled process technique unique to this invention where a laser is utilized to create the circuit shape, assisted with a metal or copper mask that has the circuit shape and size etched. Dielectric layers and metal layers are laser ablated using different power and intensity such that the laser can be tuned to ablate only dielectric and not have enough power to ablate the mask or copper layer. These embodiments provide a thin copper metal layer with the circuit trace shapes defined by etched openings, with the dielectric material exposed by the etched openings removed by either laser ablation or plasma treatment such that the resulting dielectric material has a predefined location and structure that can be subsequently processed to deposit copper utilizing a catalysts to initiate electroless copper plating, or be directly plated with electroless copper to provide an electrical bus connection for electroplating using the mask assist metal as the electrical connection to drive copper growth during plating.

FIGS. 8A and 8B are cross-sectional views of stages in the new processes described herein. FIG. 8A illustrates the PCB structure having a very thin copper coated with resist and printed and developed to expose the target circuit openings and target circuit geometry width control. The structure is then chemically etched to remove the thin copper from the target circuit opening resulting in the structure shown in FIG. 8B. As shown in FIG. 8B, a depth-controlled laser ablation is then performed that has the proper power, intensity, wavelength and settings to ablate the base dielectric in a very controlled manner within microns while at the same time not removing or excessively heating the very thin copper such that the copper acts as a mask to control the ablation only where copper is removed and not under the copper. With this construction the resist can be removed or left in place during the subsequent plating operations.

The metal mask assist laser ablation of FIGS. 8A and 8B can be enhanced with the introduction of pico-second laser systems which are very instrumental in controlled depth laser ablation. The use of the metal mask allows for precision removal of dielectric material only in the area not covered or protected by the metal mask. This process enables very straight sides walls, controlled depth, and less heat effects that disrupt dielectric or metal near the target regions. Another aspect that is beneficial is the use of the metal mask allows for the depth controlled region defining a circuit trace or a vertical via connection to be smaller than the spot size of the laser beam if that is of benefit. For example, if the spot size of the laser is 20 microns and the desired feature to be ablated is 15 microns, sizing the metal mask opening to 15 microns will result in a 15 micron ablation removal as the laser will not effect the metal mask or the material shadowed and protected by the metal mask.

Figure 9:
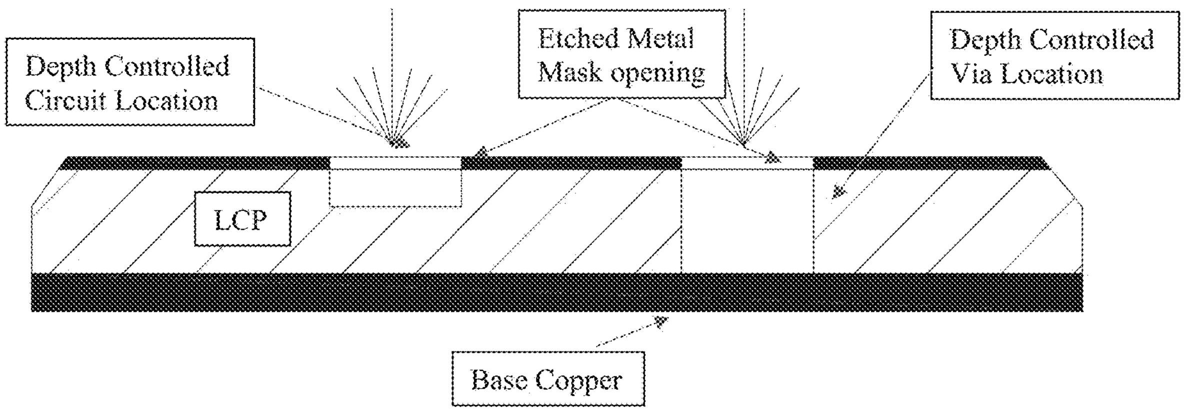
FIG. 9 is a cross-sectional view another circuit stack that allows the use of a power and wavelength beam that does not impact the copper and only ablates dielectric is evident when drilling a vertical via location.

FIG. 9 is a cross-sectional view of another example PCB illustrating another benefit of the new processes. The new processes allow the use of a power and wavelength beam that does not impact the copper and only ablates dielectric is evident when drilling a vertical via location. The beam ablates the dielectric material assisted by the metal mask to determine the via diameter and size while providing a straight side wall that extends all the way to the base copper metal while the beam can encounter the base copper metal without damage or penetration which can cause short circuits when plating operations fill the solid copper via. This aspect provides a very clean base metal target for plating without residue deposits which are an issue with conventional drilled vias where residue deposits must be removed by plasma treatment and can result in failure points with poor plating mechanical strength at the base of the via.

FIGS. 10A-10C are cross-sectional views of example stages in the new processes. These figures illustrate further processing to create the circuit trace within the controlled depth locations by coating the geometry of the circuit trace location with electroless copper, a plating catalyst, or subjecting to a permanganate solution and utilizing the thin copper on the surface as an electrolytic copper plating electrical connection bus structure. FIG. 10A shows the plating resist in place to assist with restricting the copper deposition and minimizing the surface copper added to the thin copper layer. FIG. 10B shows the resist removed post plating or pre-plating. FIG. 10C illustrates a stage after FIG. 10B wherein the circuit-bearing dielectric layer is further processed to remove the base copper if present, as well as etch away residual thin surface copper used for mask and electrolytic copper plating with the resulting structure consisting of base dielectric and circuit traces that reside within the dielectric layer.

Figure 11:
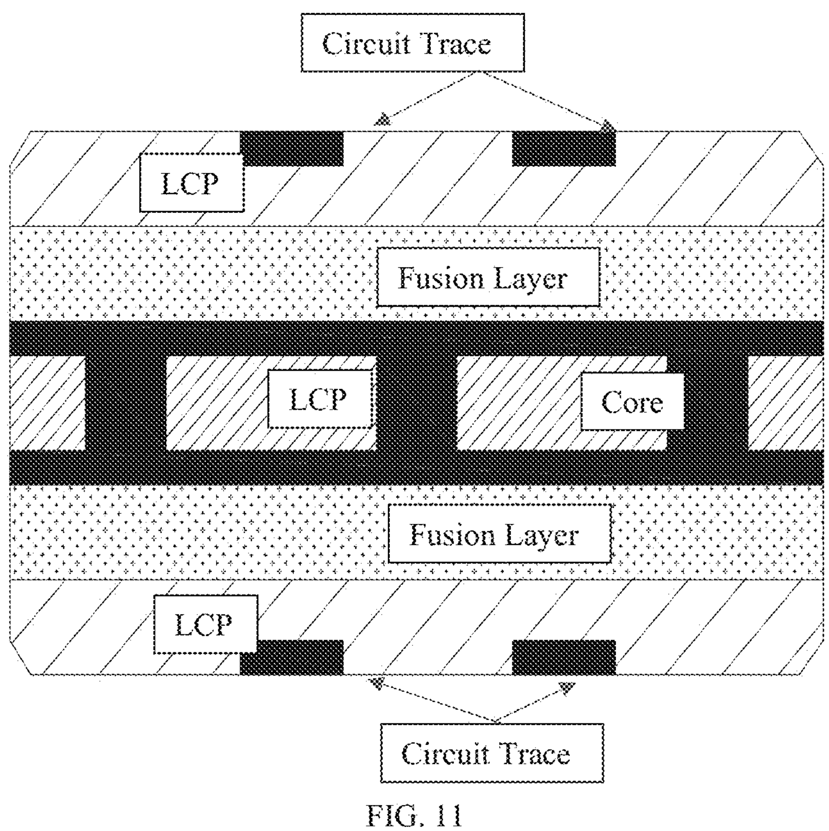
FIG. 11 is a cross-sectional view of an example circuit stack where the circuit-bearing dielectric layers are laminated and fusion bonded to a predefined and prefabricated core circuit that serves as the center base of the final circuit stack.

FIG. 11 is a cross-sectional view of an example PCB where the circuit-bearing dielectric layers are laminated and fusion bonded to a predefined and prefabricated core circuit that serves as the center base of the final circuit stack. There is benefit to process both sides of the core at the same time to balance the circuit stack and allow for layer to layer registration on each side of the core. The fusion layer can be a dielectric layer of LCP or a closely matched dielectric that is a thermoset or epoxy based material that when cured does not flow during subsequent laminations. In some cases a core is not used with build up layers.

Figure 12:
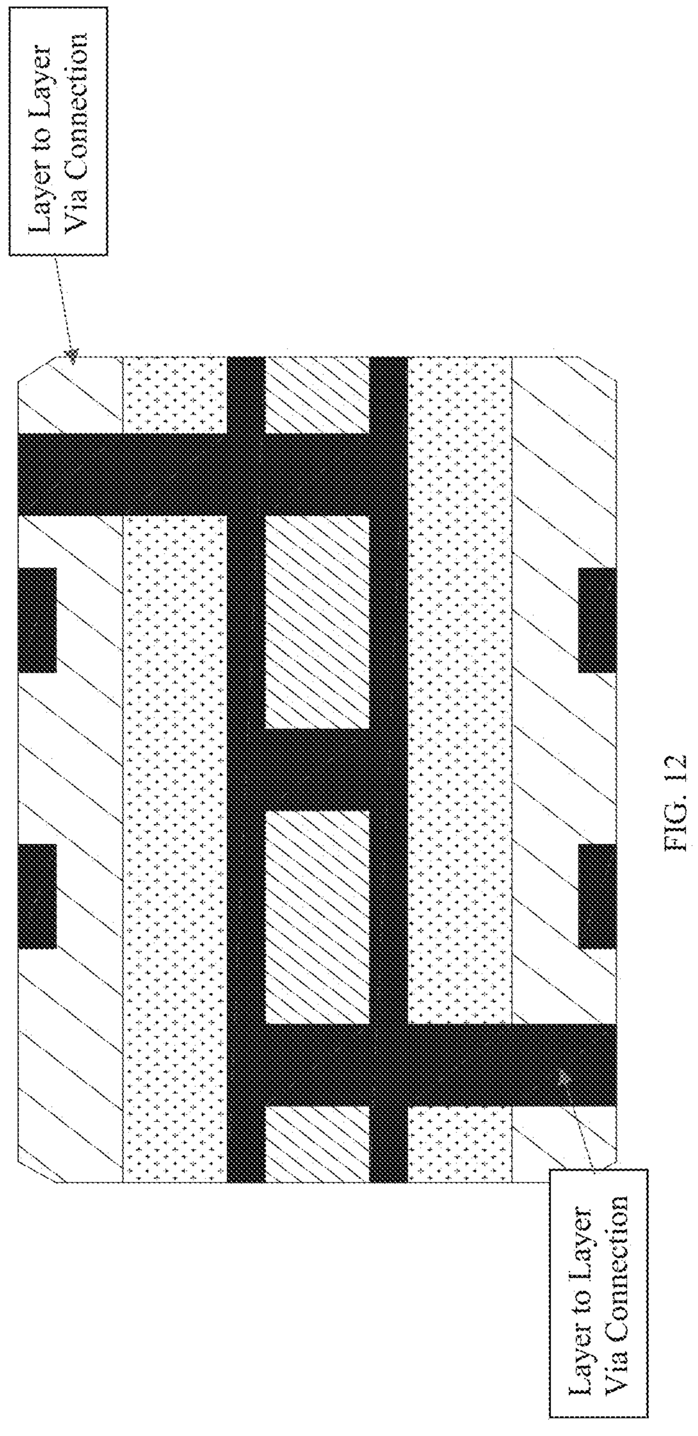
FIG. 12 is a cross-sectional view of an example circuit stack wherein vertical solid copper via connections are made from layer to layer by laser ablation of the dielectric material to create a plating path to a previous metal layer or capture pad target.

FIG. 12 is a cross-sectional view of an example PCB wherein vertical solid copper via connections are made from layer to layer by laser ablation of the dielectric material to create a plating path to a previous metal layer or capture pad target. This process step can be conducted prior to removal of the thin copper mask layer such that the via drilled hole benefits from the metal mask assist, while the circuit traces contained within the circuit bearing dielectric are masked during via plating to avoid adding additional surface copper to the circuit traces or thin copper layer used for bussing.

Figure 13:
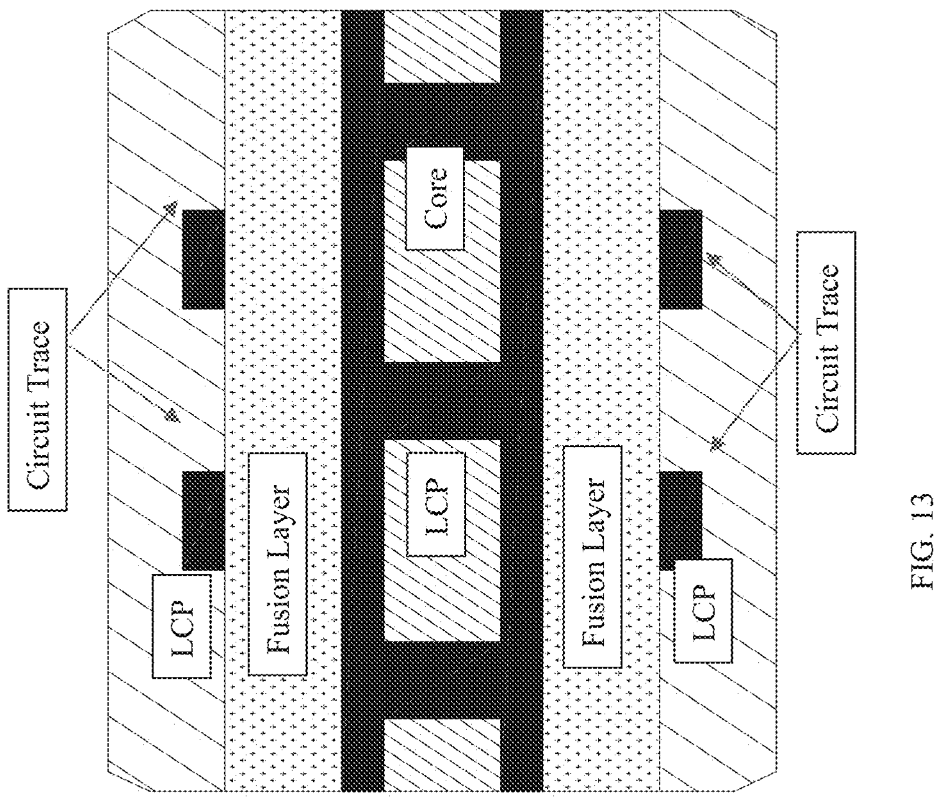
FIG. 13 is a cross-sectional view of an example circuit stack mirrored or contained within the inner surface of the circuit bearing dielectric layers.

FIGS. 11 and 12 are examples in which the circuit bearing dielectric layer is added to the core with the circuit traces oriented on the outer or exposed surfaces both sides. There may be desire depending on the circuit stack design, to have the circuit traces mirrored or contained within the inner surface of the circuit bearing dielectric layers as shown in FIG. 13.

Figures 14, 15:
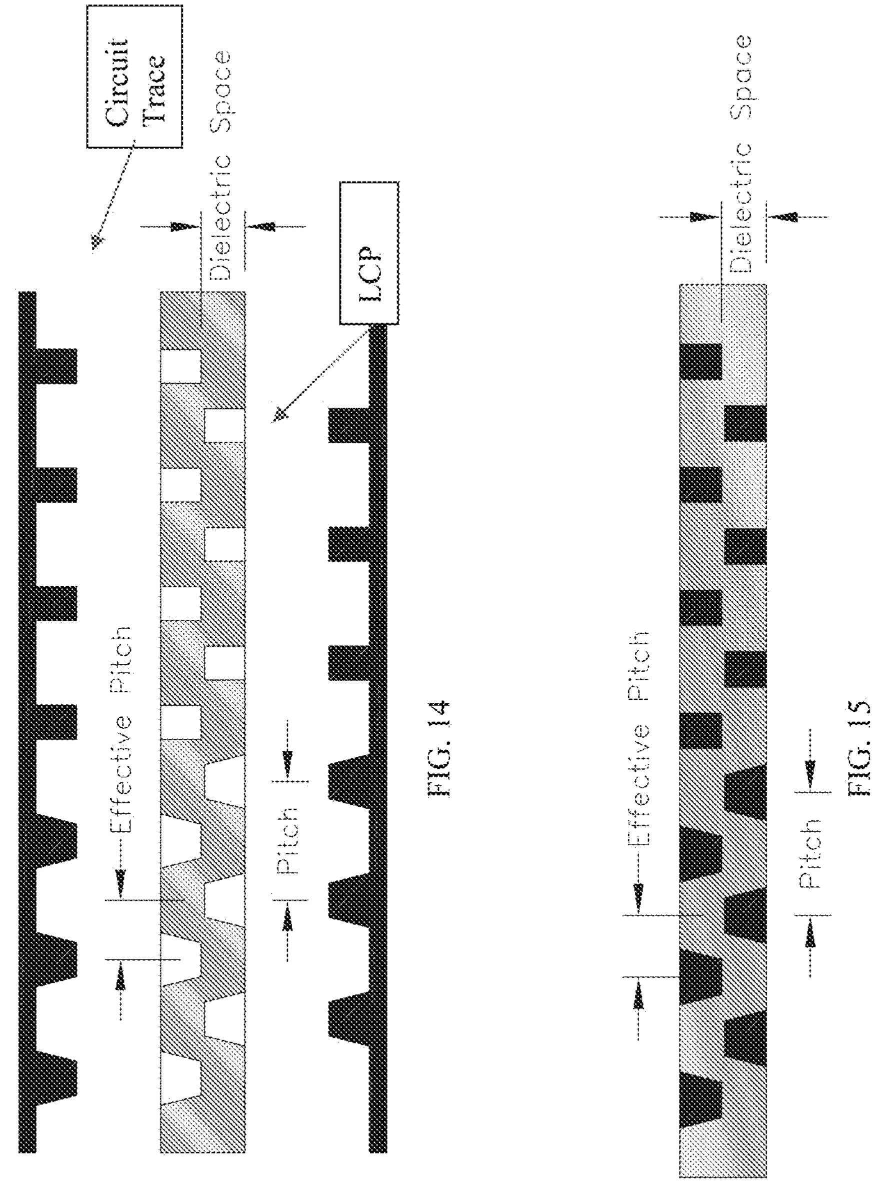
FIG. 14 is a cross-sectional view of an example circuit stack that illustrates the use of both sides of a given dielectric layer to create a structure that bears two (2) circuit patterns embedded within the same dielectric layer.
FIG. 15 is a cross-sectional view of an example circuit stack that shows the adjustment of the dielectric spacing to allow for precision impedance tuning with finer lines and spaces while reducing the effective pitch between circuits.

FIG. 14 is another example that illustrates the use of both sides of a given dielectric layer to create a structure that bears two (2) circuit patterns embedded within the same dielectric layer. This process continues for multiple sequences of circuit-bearing dielectric layers with vertical vias connecting the circuit layers as needed. There may be instances where a combination of dual circuit layer bearing dielectrics may be mated or connected with vertical solid copper vias to single circuit layer bearing dielectric layers to achieve the desired circuit stack and balance the resulting metal and dielectric layers.

The ability to create circuit bearing dielectric layers with single sided circuits facing up and/or down as well as dual circuit bearing dielectric layers with circuits both sides provides significant density improvements over convention circuit fabrication limited by clearance required for vertical solid copper via locations from circuit layer to circuit layer. This structure also enables adjustment of the dielectric spacing (shown in FIG. 15) to allow for precision impedance tuning with finer lines and spaces while reducing the effective pitch between circuits.

Figures 16A, 16B, 16C, 17A, 17B, 17C:
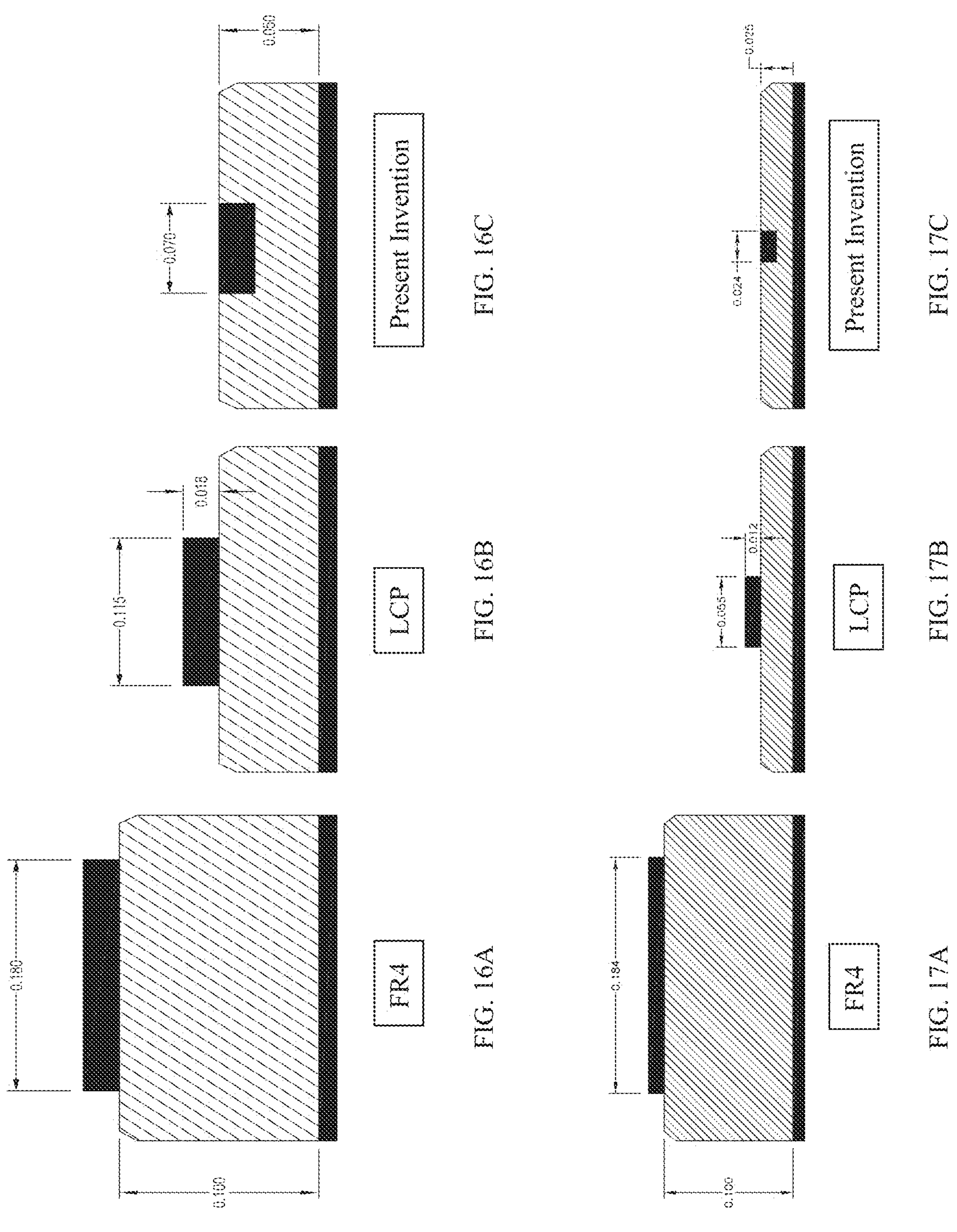
FIGS. 16A-16C are cross-sectional views of example circuit stacks illustrating the relative size comparison of different processes.
FIGS. 17A-17C are cross-sectional views of more example circuit stacks illustrating the relative size comparison of different processes.

FIGS. 16A-16C are cross-sectional views of example circuits illustrating the relative size comparison of different processes. FIGS. 16A-16C are a comparison of a simple surface microstrip circuit with 50 ohm target impedance. FIG. 16A is standard FR4 material in a 100 micron thickness with 18 micron thick copper. This is a standard construction used in most electronics today. The 50 ohm impedance target drives a trace width of 180 microns. FIG. 16B shows the relative physical reduction of an equivalent circuit using the same 18 micron copper with standard 50 micron LCP which results in a trace width reduction to 115 microns. FIG. 16C illustrates the benefit of the new processes described herein applied to the same 50 micron thick LCP and the same 18 micron thick copper with embedded trace width reduction down to 70 microns. The resultant overall thickness from the new processes is also thinner by the physical thickness of the copper circuit since the trace is embedded into the LCP rather than proud of the surface.

FIGS. 17A-17C are cross-sectional views of more example circuits illustrating the relative size comparison of different processes. FIGS. 17A-17C illustrate the further advantages of the new processes described herein with copper thickness reduced to 12 microns. The equivalent 100 micron thick FR4 circuit shown in FIG. 17A is now 184 microns wide as shown in FIG. 17C. Typical FR4 material is available down to 100 micron thickness, while LCP material is available down to 25 micron thickness. FIG. 17B illustrates 25 micron thick LCP with 12 micron thick copper shows a trace reduction down to 55 microns. The same 25 micron thick LCP shown in FIG. 17C made in accordance with the new embedded trace processes shows a trace reduction down to 24 microns.

Figures 18A, 18B, 18C, 18D, 20, 21:
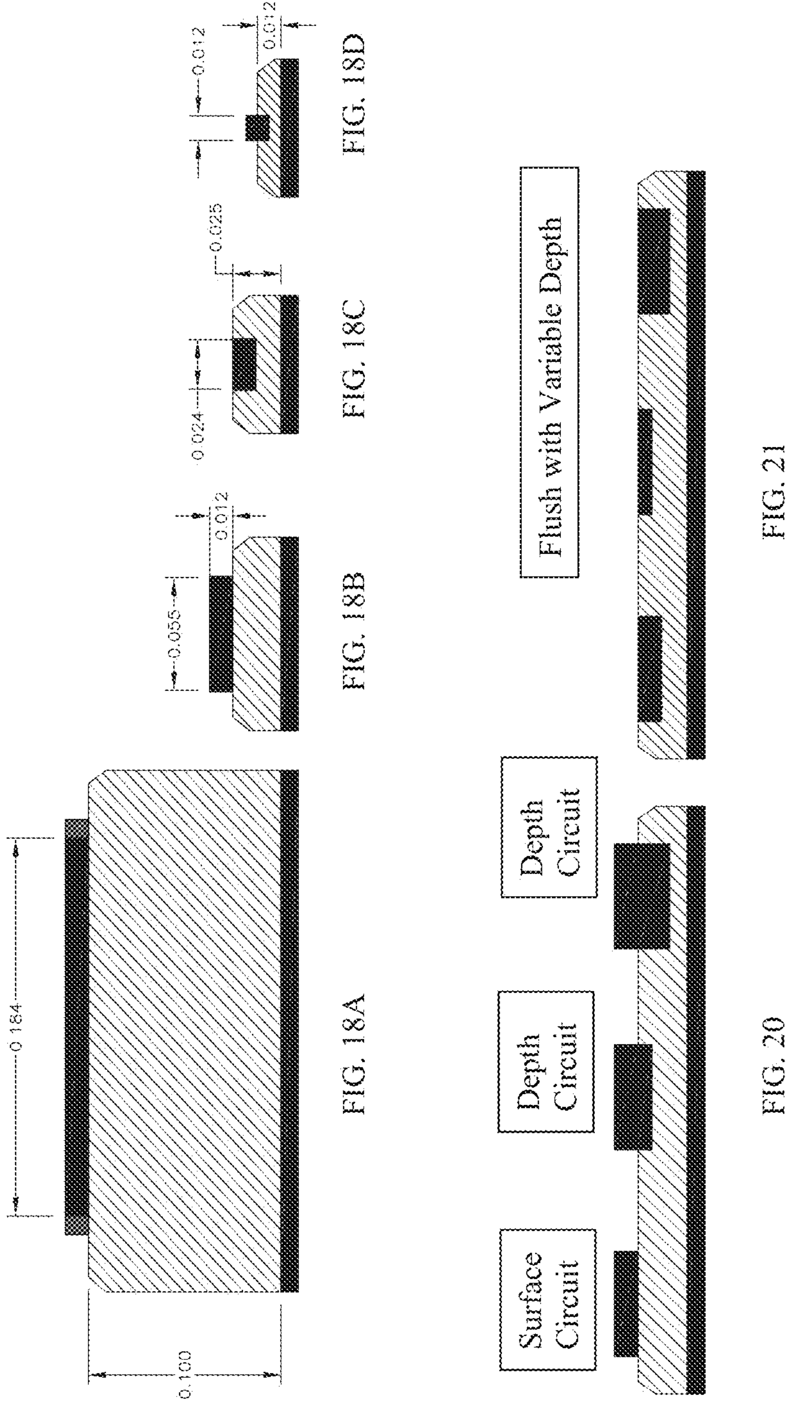
FIGS. 18A-18D are cross-sectional views of more example circuit stacks illustrating the relative size comparison of different processes.
FIG. 20 is a cross-sectional view of an example circuit stack where the circuit traces can be created with adjustable thickness on either the same or different PCBs, as well as adjustable position within the circuit bearing dielectric layer.
FIG. 21 is a cross-sectional view of an example circuit stack where the circuit traces can be created with adjustable depth for completely embedded circuits.

FIGS. 18A-18D are cross-sectional views of more example circuits illustrating the relative size comparison of different processes. FIG. 18A corresponds to standard FR4 material. FIG. 18B corresponds to semi-additive LCP process. FIG. 18C corresponds to the new processes described herein. FIG. 18D corresponds to the new processes described herein wherein the trace extends partially below and partially above the dielectric (e.g., LCP) layer. That is the trace is partially embedded in the dielectric layer while also extending above a surface of the dielectric layer. These simple equivalent circuits readily illustrate the novelty, uniqueness and benefit of the new processes described herein. These benefits also extend to the many different circuit styles, designs and more complex interconnects required for integrated electronics. The circuit bearing dielectric layer structure not only allows for circuit size reduction, but the new processes allows for circuit geometries not possible with conventional print and etch or traditional semi-additive processes.

FIG. 20 illustrates the further advantage of the new processes where the circuit traces can be created with adjustable thickness on either the same or different PCBs, as well as adjustable position within the circuit bearing dielectric layer. FIG. 21 illustrates the same adjustable depth for completely embedded circuits. Typical circuit structures contain circuits on a given layer that are the same thickness and have the same relative dielectric separation and distance to reference planes. The process described herein allow for the circuit traces to vary in height, width, cross section, dielectric separation and distance to reference planes by controlling the depth of the circuit trace ablation location, with width of the resist definition, and the thickness of resist with corresponding electrolytic plating thickness on the same circuit and on different circuits. In some cases the circuit bearing dielectric layer can have partially plated copper via columns that correspond to a clearance opening in the fusion and or next dielectric layer that can be electroplated shut to complete connection structure.

The new processes described herein allow for circuits to be on the surface of the dielectric layer as a reference with variable depth circuits that reside within the dielectric and having a final height planar to the target height across the entire circuit layer as shown in the left drawing above. In FIG. 20, the variable depth circuit patterns can be flush to the surface of the dielectric. The ability of the new processes to vary the circuit trace thickness and relative dielectric separation allows the circuit designer the ability to provide precision impedance control with multiple impedance targets adjustable on the same or sequential layers simply by adjusting the depth, height, and/or width of the circuit while considering clearance needed for vertical solid copper via locations. This principle is very helpful when designing a system circuit that needs high density fine line and space circuits for high I/O signal application while being able to increase the circuit cross section for power delivery, isolation, or allow for vertical via clearance adjustment by adjusting the nearby trace cross section as needed.

Figures 22A, 22B, 23:
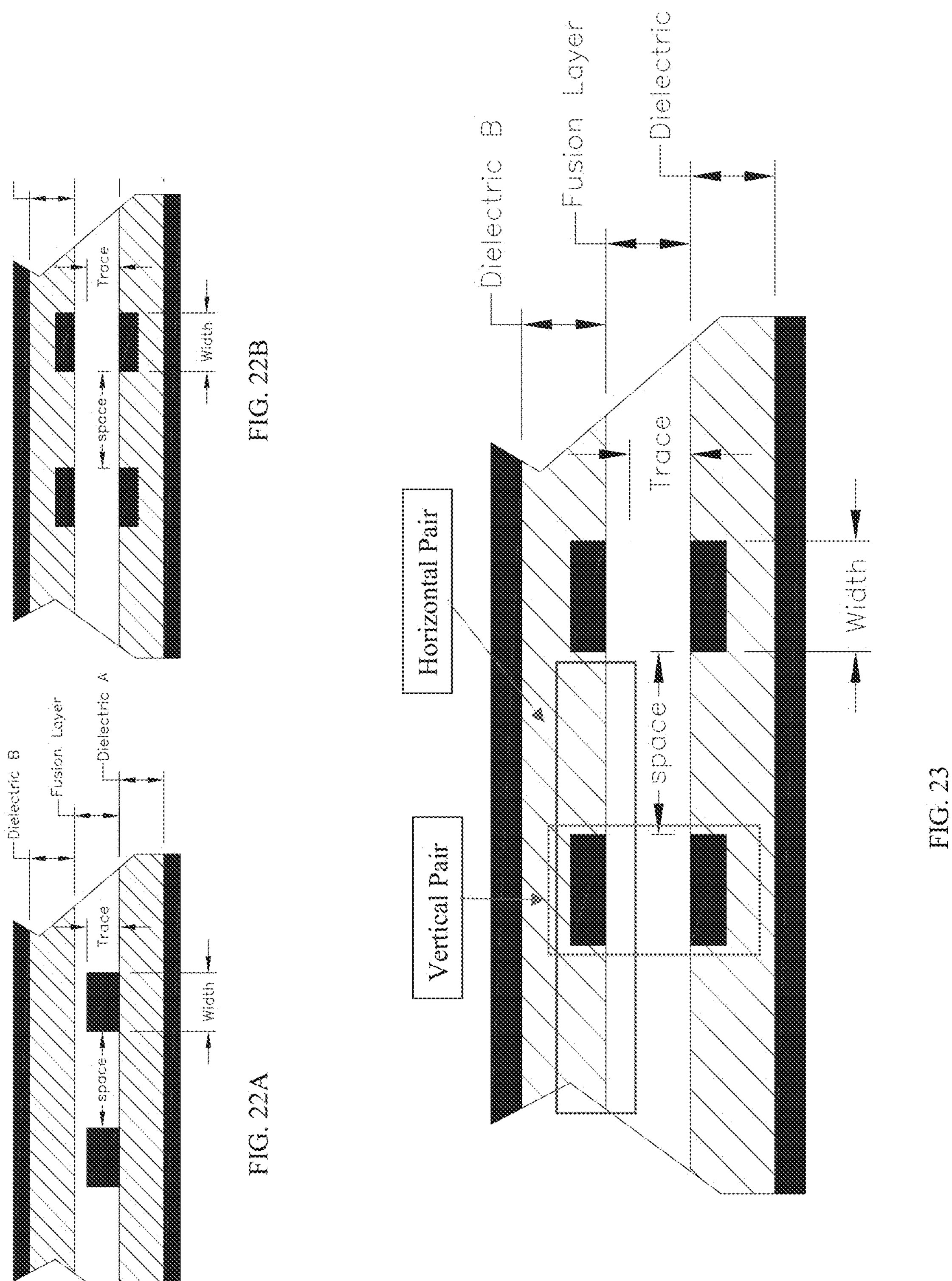
FIGS. 22A and 22B are cross-sectional views of a standard process compared to the new processes described herein to illustrate the potential density improvement.
FIG. 23 is a cross-sectional view of an example circuit stack showing a design opportunity provided by the PCB structure of FIG. 22B.

FIGS. 22A and 22B are cross-sectional views of a standard process compared to the new processes described herein to illustrate the potential density improvement. They show an example density improvement for an existing differential strip line design (FIG. 22A) compared to new processes (FIG. 22B) where multiple pairs can be fabricated in the same physical space and thickness.

FIG. 23 highlights design opportunity provided by the PCB structure of FIG. 22B. A typical differential pair is constructed as previously shown with the circuit traces on the same layer, same plane, same thickness and defined separation from each other and associated ground reference planes. This can be called a horizontal differential pair. A challenge with designing a horizontal differential pair is having the circuit lengths for each trace in the pair the same. Geometry dictates that when two lines are created in the same plane, each line will have a different length. The impact of this geometric condition on a signal is often called skew, which relates to the potential issues encountered with a pair that has different lengths. While the invention leverages conventional horizontal pairs, the structure allows for theoretical vertical differential pairs where the circuits essentially fall within each others shadow and have the same physical length with a precise, controlled distance of separation and space between traces. Within appropriate design rules, the circuit density may be increased by vertical pairs.

Figure 24A:
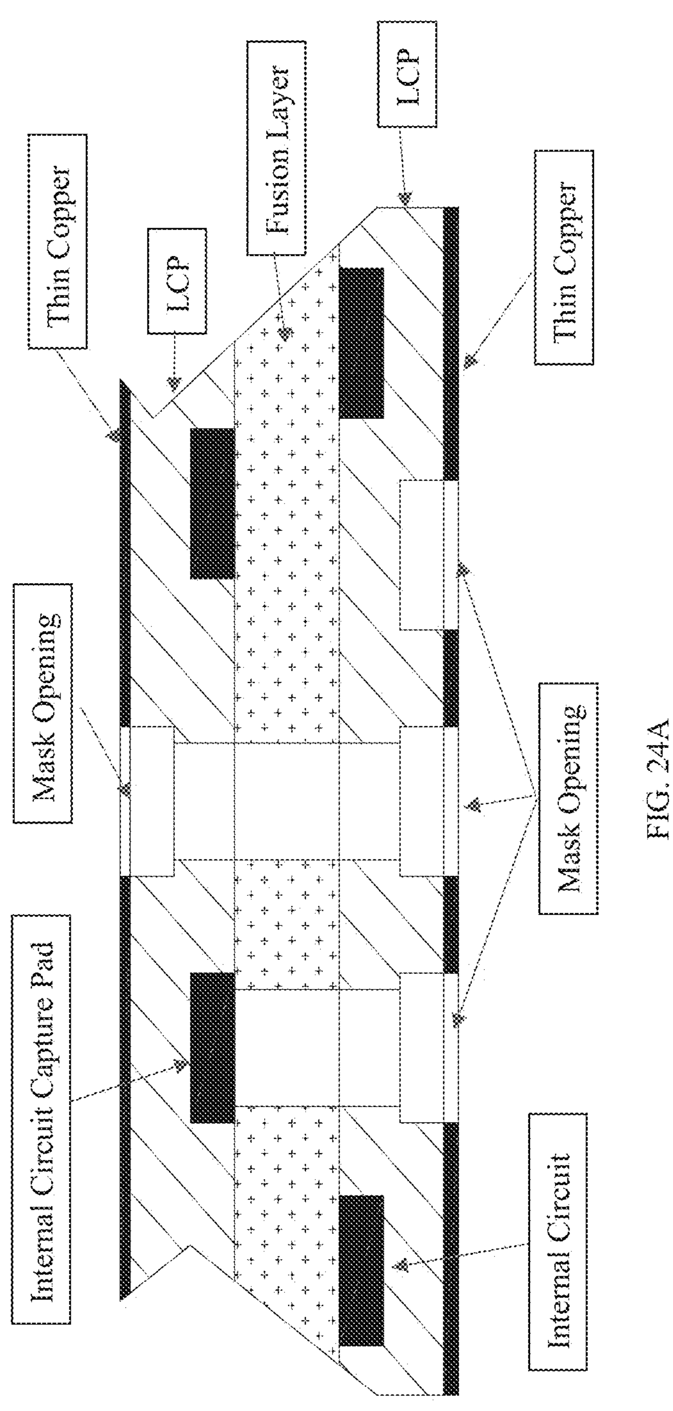
FIGS. 24A and 24B are cross-sectional views of an example stages of a circuit stack in the new processes described herein with vertical via connections between layers.
Figure 24B:
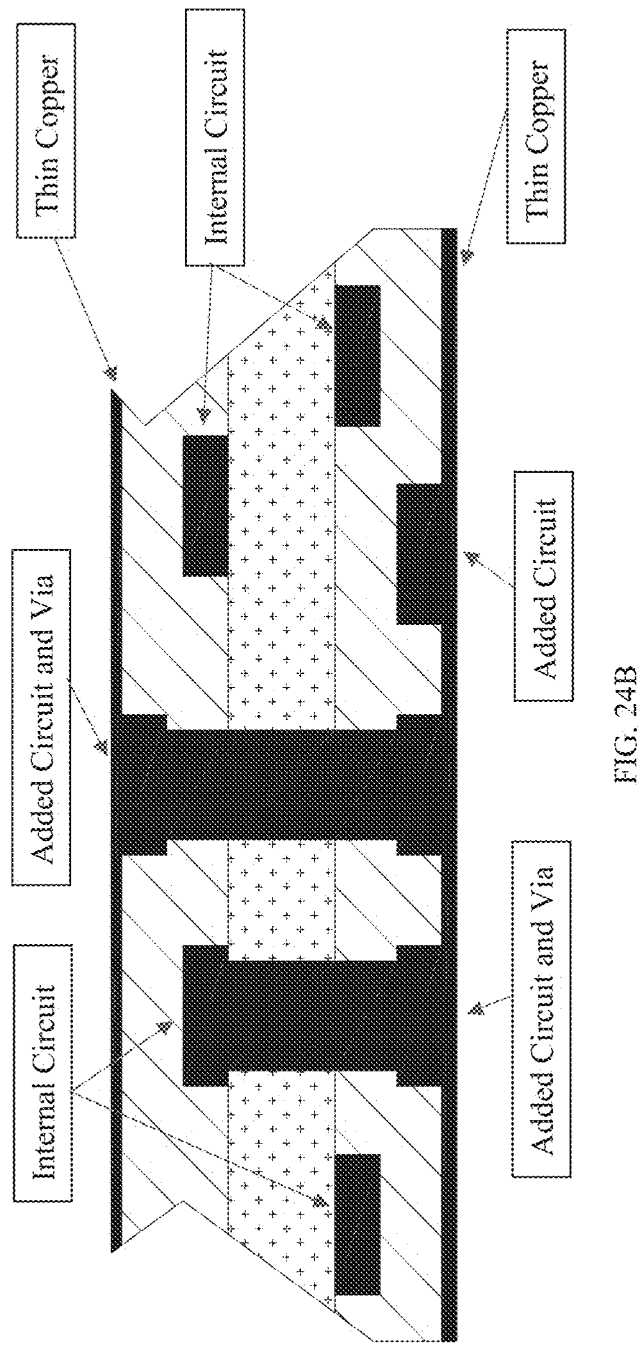

FIGS. 24A and 24B illustrate example stages of the new processes described herein with vertical via connections between layers. As shown in FIG. 24A, mask openings in the thin copper layer serve as via target locations where a laser is used to ablate material and drill down to an internal capture pad or metal layer. In addition, in the event the circuit bearing dielectric layer is bonded with one side internal circuits, the exposed outer surfaces of the assembly can be processed by adding circuit target locations at the same time as via locations are added to exposed surfaces. The laser ablation technique removes only the dielectric material at the mask target areas and the PCB structure includes a metal capture pad target internal to stop the laser ablation at the metal target. FIG. 24B shows the circuit stack of FIG. 24A after the circuit stack is further processed by treating the newly created dielectric circuit targets and via locations with a plating catalyst, permanganate, electroless copper and subjected to electrolytic copper plating using the thin copper mask as a plating bus. At this process step, new outer surface circuits can be added as well as blind or through vias limited by plating aspect ratios and proper clearance of pre-existing circuits.

Figures 25A, 25B, 25C, 26A, 26B, 26C:
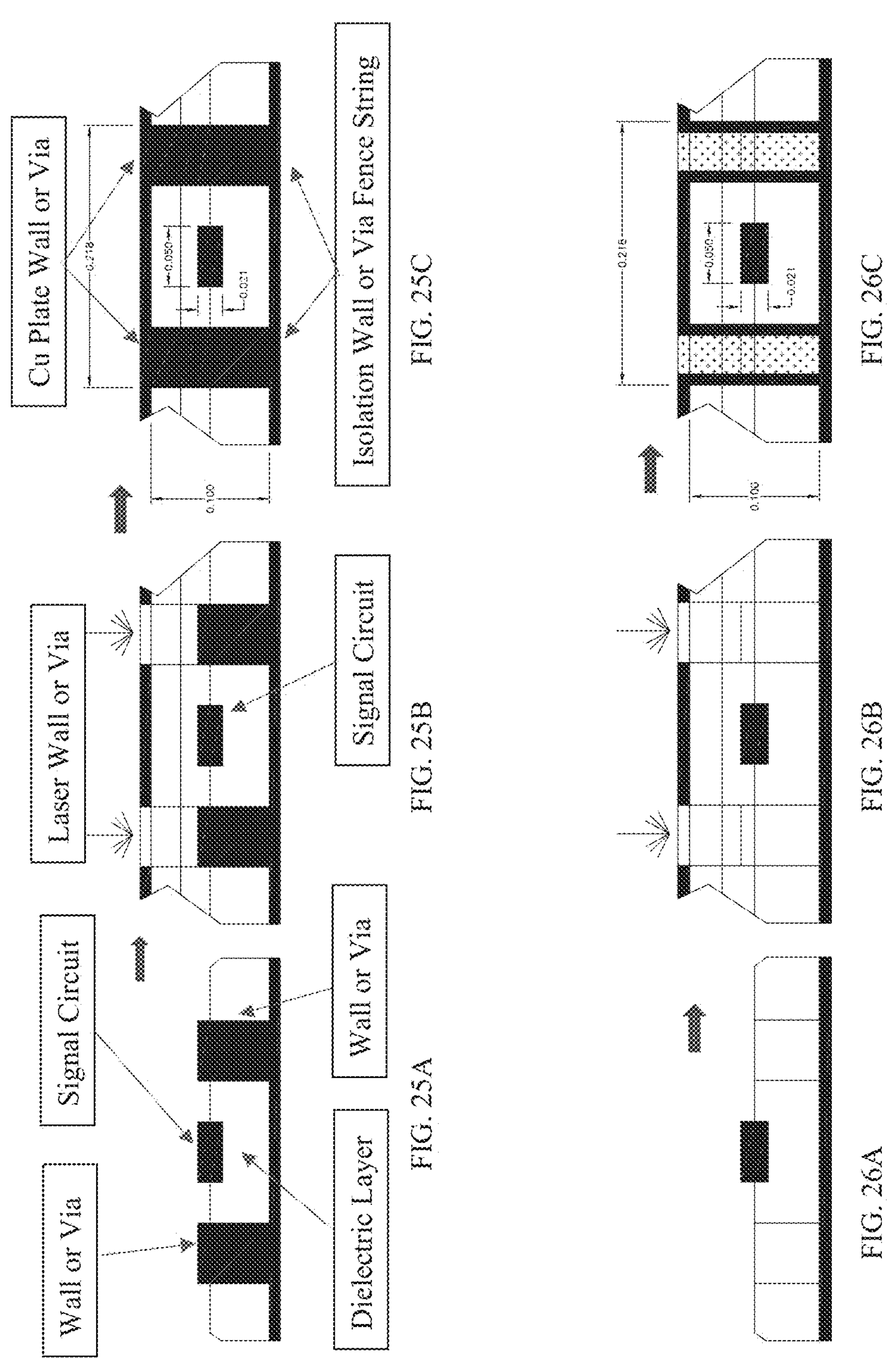
FIGS. 25A-25C are cross-sectional views of an example stages of a circuit stack in a process from a circuit bearing dielectric layer that has a pre-fabricated structure with a signal circuit down the approximate center and a shielding structure that is either a solid thick circuit trace that extends through the dielectric layer or a string of plated vias at the appropriate spacing away from and along the signal circuit.
FIGS. 26A-26C are cross-sectional views of an example stages of a circuit stack illustrating another option for constructing vertical isolation walls.

Another advantage of the new processes is the ability to isolate and shield signal lines and vias within the construction by including features within the circuit bearing dielectric layer that when further processed create isolation features to improve signal integrity and alleviate cross talk between signal lines. This principle is similar to a coaxial cable and can be constructed with a single signal circuit or pair. FIGS. 25A-25C illustrates progression of process from a circuit bearing dielectric layer that has a pre-fabricated structure with a signal circuit down the approximate center and a shielding structure that is either a solid thick circuit trace that extends through the dielectric layer or a string of plated vias at the appropriate spacing away from and along the signal circuit.

The dimensions in FIGS. 25A-25C are in microns and are for reference as an estimate of how beneficial this aspect of the invention is, with a range of magnitude physical size that is potentially several orders of magnitude smaller than a conventional coaxial cable. One aspect of the circuit bearing dielectric layers that is of benefit is the ability to contain a partial segment or section of the isolation features such that the aspect ratio for electrolytic copper plating can be 1:1 of opening size to dielectric thickness. The ability for the signal circuit to staddle the base dielectric surface is a key aspect of precision location of the conductor relative to the isolation features with having the conductor-centered ideal.

FIGS. 26A-26C illustrate another option for constructing vertical isolation walls. In this option, the sidewalks of the laser ablated features are metalized rather than plating solid copper which can have an impact to lateral density due to required plating aspect ratios. The isolation features create a reference a thin layer of copper plated to the wall surfaces, with filler added to prevent air entrapment during lamination or subsequent solder reflow.

FIGS. 27A-27C illustrate the construction of coaxial vias. In this case the circuit trace is fabricated with a capture pad location that is isolated from the grounding sidewalls that form a ring around the vertical transition to a via location, with ground walls extended to the next subsequent ground plane. The regions surrounding the center signal via are filled with dielectric to eliminate any entrapped air that may expand or cause explosion during lamination or subsequent solder reflow. In some cases, the ground rings and center signal via may be self-contained within the dielectric layer with a surface-to-surface electrical connection achieved during lamination with slight surface interference.

FIGS. 28A-28C illustrate another significant benefit to this aspect of the new processes, which is the ability to implement vertical circuit walls can allow for vertical power rails, thermal management, and other functions beyond isolation.

Figures 29A, 29B, 30A, 30B:
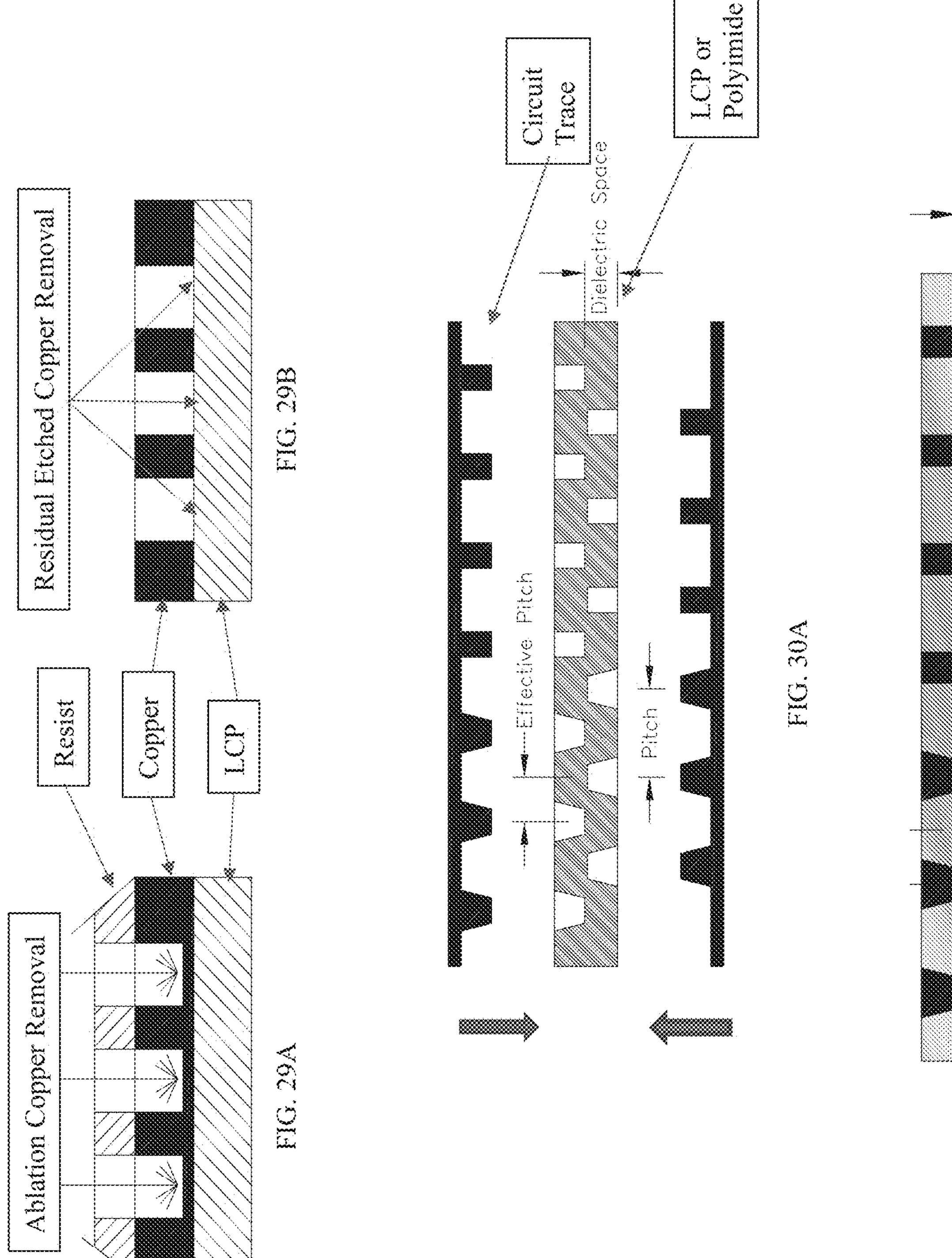
FIGS. 29A and 29B are cross-sectional views of an example circuit stacks illustrating another aspect of the new processes which is to create a circuit bearing dielectric layer that has laser ablation through resist that has been cured with a wavelength and power setting appropriate to remove copper from a thicker layer of copper down to within 1-5 microns of the dielectric surface.
FIGS. 30A and 30B are cross-sectional views of an example circuit stacks showing an alternative process to create a circuit bearing dielectric layer with circuits contained on one surface or both surfaces is to pre-fabricate the circuit pattern carried by a copper layer which may be supported by a carrier for material handling purposes.

FIGS. 29A and 29B illustrate another aspect of the new processes which is to create a circuit bearing dielectric layer that has laser ablation through resist that has been cured with a wavelength and power setting appropriate to remove copper from a thicker layer of copper down to within 1-5 microns of the dielectric surface. This process enables a relatively thick base copper layer to be processed to enhance the ability to print and etch a cross section of copper with a higher aspect ratio than typical print and etch applications. Resist is left in place after copper ablation such that the resultant post-ablation circuit trace is protected from etchant and the remaining residual thin copper layer can be quickly etched away without damage to desired trace.

FIGS. 30A and 30B are an alternative process to create a circuit bearing dielectric layer with circuits contained on one surface or both surfaces is to pre-fabricate the circuit pattern carried by a copper layer which may be supported by a carrier for material handling purposes, such that the raised or proud circuit patterns can be impressed into a LCP dielectric area such that the LCP as a thermo-plastic material deforms to accept the pattern and bonds to the circuit structures. This structure can also be fabricated with cast, printed, or spin-coat liquid dielectric. The carrier copper is then etched away to reveal the circuit pattern contained within the dielectric layer as shown in FIG. 30B.

FIGS. 31A-31C are magnified images showing the example structure of Porous Liquid Polymer dielectric, which is another benefit of the new processes, that is allows the use of Porous Liquid Polymer dielectric, which is a proprietary aspect leveraging existing use of thermos-plastics to create a porous matrix within a polymer layer. The basic process is currently used by several companies making filtration and wicking type products for commercial or industrial use. There are 2 main types of processes, one being the sintering of tiny polymer particles in a controlled manner such that a relatively consistent aggregate porosity is achieved when the polymer particles are essentially melted together. FIG. 32 is a table listing common polymer types used for the sintering production of a porous polymer matrix.

FIGS. 33A-33C are magnified images showing the example structure in which very fine polymer fibers are used, referred to herein as "Porous Fiber" material. This is very similar in principle to the sintered particle process, with the difference being very fine polymer fibers are created and arranged such that under heat and pressure a controlled porosity is achieved. FIG. 34 is a table illustrating example polymer types used for the Porous Fiber material, which are similar to the Sintered Particle porous material. Although Liquid Crystal Polymer or LCP is not on the list of available materials, the processes described herein are applicable to an LCP version of both Porus material types. The ability to control the porosity is a significant opportunity combined with the unique properties of LCP material, mechanically as well as the aggregate dielectric constant.

Figures 35A, 35B, 36A, 36B:
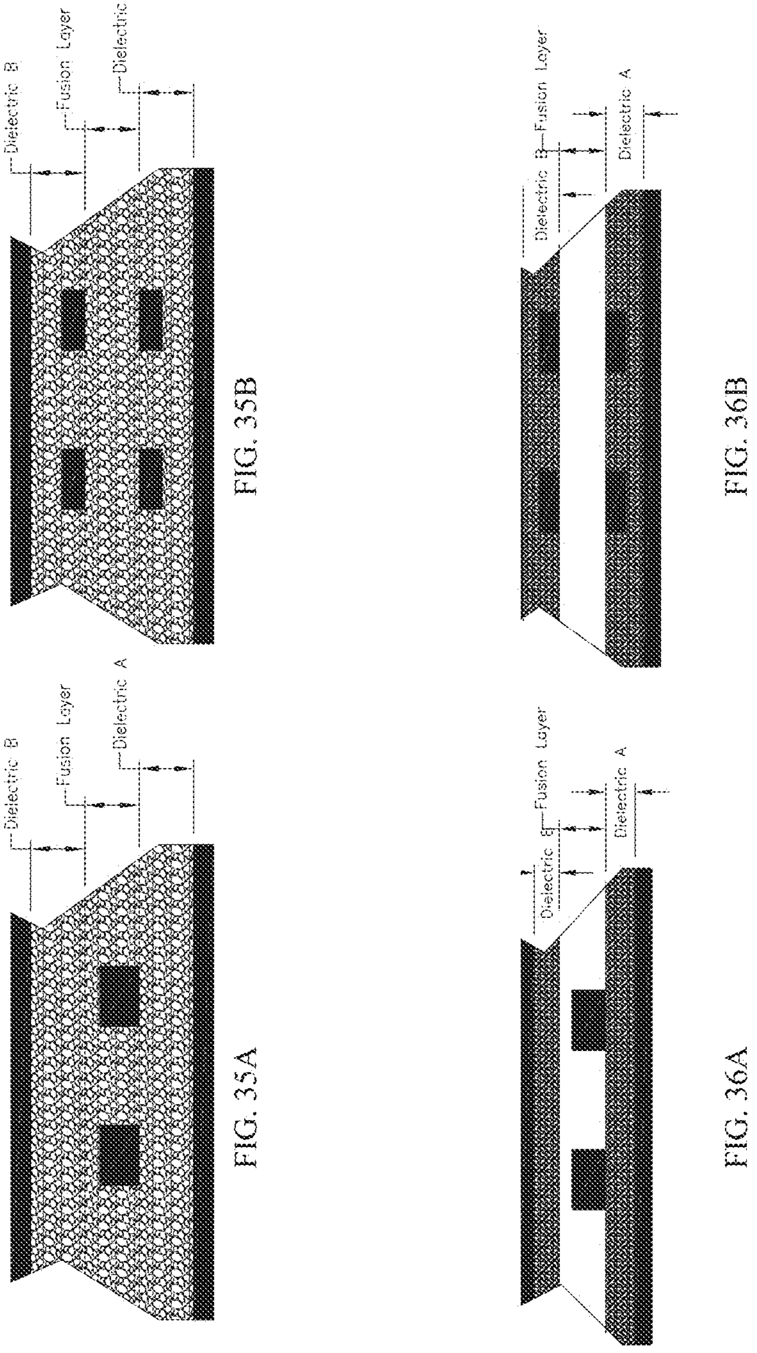
FIGS. 35A and 35B are cross-sectional views of an example circuit stacks showing a comparison between a standard construction and a construction according to the new processes where the dielectric layers are porous LCP material laminated similar to conventional LCP films.
FIGS. 36A and 36B are cross-sectional views of an example circuit stacks showing a comparison between a standard construction and a construction according to the new processes.

There are some potentially significant circuit-related advantages with a Porous LCP material. The porous region of the material is essentially air, which is the best dielectric material available for high circuit and device performance. Combining the low loss properties of LCP which already has a relatively low dielectric constant with an internal air matrix may prove to be very valuable from a circuit standpoint. FIGS. 35A and 35B show a comparison between a standard construction (FIG. 35A) and a construction according to the new processes (FIG. 35B) described herein, where the dielectric layers are porous LCP material laminated similar to conventional LCP films. In the event LCP is used as the bond layer there may be some advantage to the porous LCP conforming to the circuit patterns during lamination.

FIGS. 36A and 36B show a comparison between a standard construction (FIG. 36A) and a construction according to the new processes (FIG. 36B) described wherein a benefit is collapsing of the porosity within the porous LCP such that the effective dielectric thickness and spacing reduced as a result of the porosity openings becoming closed during heat and pressure. The additional benefit of the porosity is the potential improvement in bonding strength as the porosity features add mechanical roughness to enhance a bonding interface relative to a smooth dielectric surface. The porosity may also have significant benefits to plating operations by providing microscopic anchor points to capture catalyst or seed copper that enhances plating activation or peel strength. In contrast, a slight press or laser processing may close porous openings in desired regions, shapes or patterns which acts as a plating adherence inhibitor with untreated areas with open porosity favored for plated regions.

Another aspect of the new processes that benefits greatly from a porous LCP dielectric is instances where the material is printed with a dielectric or conductive ink such as inkjet or aerosol printing where the porous nature of the surface combined with the hygroscopic nature of LCP drives a wicking action into the surface. This aspect of the new processes is aimed at using a liquid crystal polymer material as a circuit-bearing dielectric material with the combination of LCP films, dielectric material either in liquid or sheet form, and a series of additive and subtractive steps to create very thin high-performance circuit structures that can replicate or replace conventional technologies as well as provide the opportunity for increased circuit density.

Figure 37:
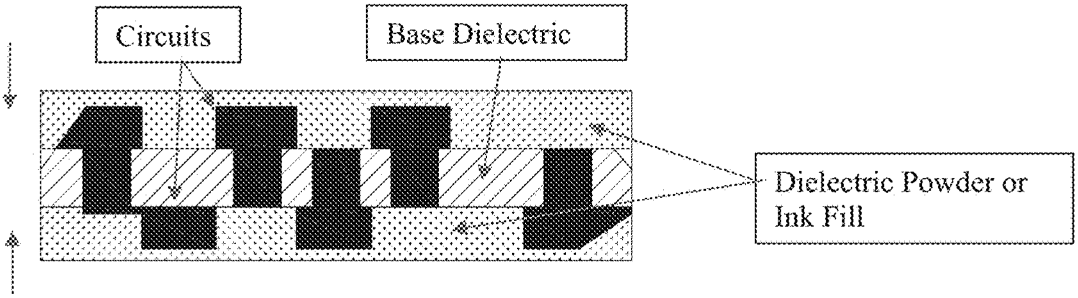
FIG. 37 is a cross-sectional view of an example circuit stack illustrating an aspect of the new processes.

As lines and spaces reduce, the thickness of the dielectric can be important for dielectric separation to be maintained with electrical properties of the dielectric material tuned for the desired impedance and loss environment. As the dielectric layer thickness thins, it is increasingly difficult to process films. FIG. 37 illustrates an aspect of the new processes, which is to apply LCP or other dielectrics in very fine powder form to the exposed circuit patterns and fusion bond the particles to the copper circuit patterns and the base core LCP with a lamination process or thermal cycle that melts the particles very quickly without melting the base LCP due to the small fine size of the particle and lower thermal mass.

LCP material is used as an example because it is a thermoplastic that will stick to itself after processing, but other materials are possible as well to achieve the desired fill and dielectric properties such as ABF, Polyimide, Polyamide, Teflon, Ceramics, Fine Glass etc. Another aspect of this is to mix various particles of dielectric such as LCP plus Teflon, or LCP Plus ABF, or LCP plus Born Nitride or Alumina, or LCP plus a bonding agent that has a lower melt point with a wide assortment of mixtures possible depending on the desired dielectric properties and mechanical needs. Another aspect is the use of low-loss dielectric resins, liquids, or bonding agents that can be filled with LCP particles and spin-coated, screen-printed, inkjet printed, sprayed or aerosol deposited with sufficient viscosity and bond strength when cured by air, heat, temperature, pressure etc.

Figure 38:
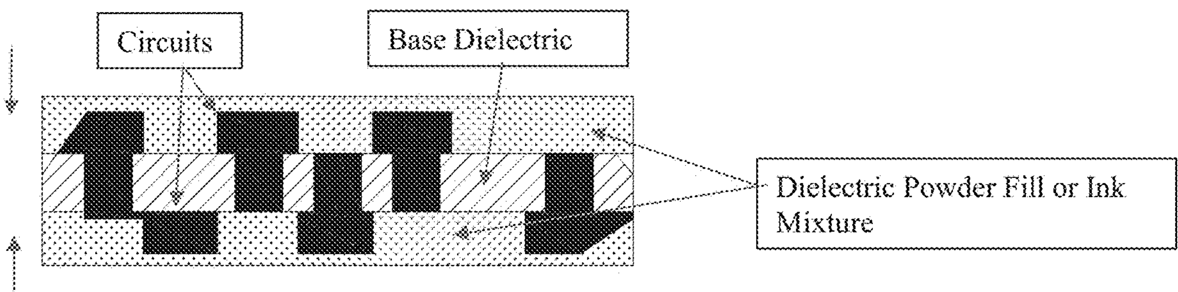
FIGS. 38 and 39 show alternative variations to FIG. 37.
Figure 39:
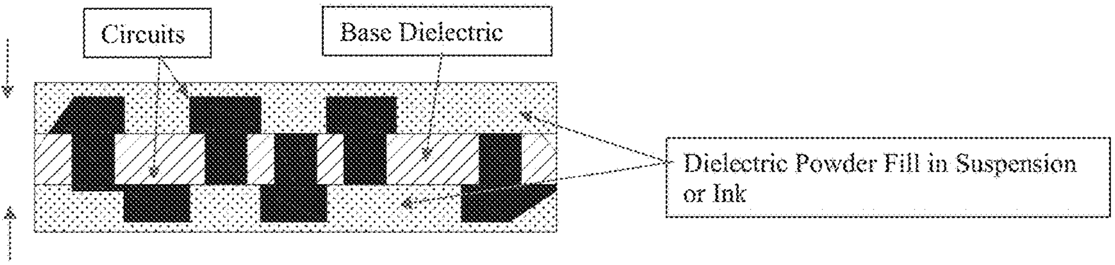

FIGS. 38 and 39 show alternative variations. In some cases, dry powder may be used with an electrostatic charge present to control the location of the particles until processed. In some cases, it may be desirable to place the particles in suspension to create a slurry, paste, or ink such that the materials can be deposited in a controlled manner without loose particles residing where not desired. This semi-liquid dielectric can be processed to drive off the suspension material and leave the proper dielectric materials in the desired locations with precise thickness and dimension.

In general, the new processes can deposit these dielectric materials over and onto solid copper circuits and features as opposed to copper or silver bearing inks which have high bulk resistance.

Figure 40:
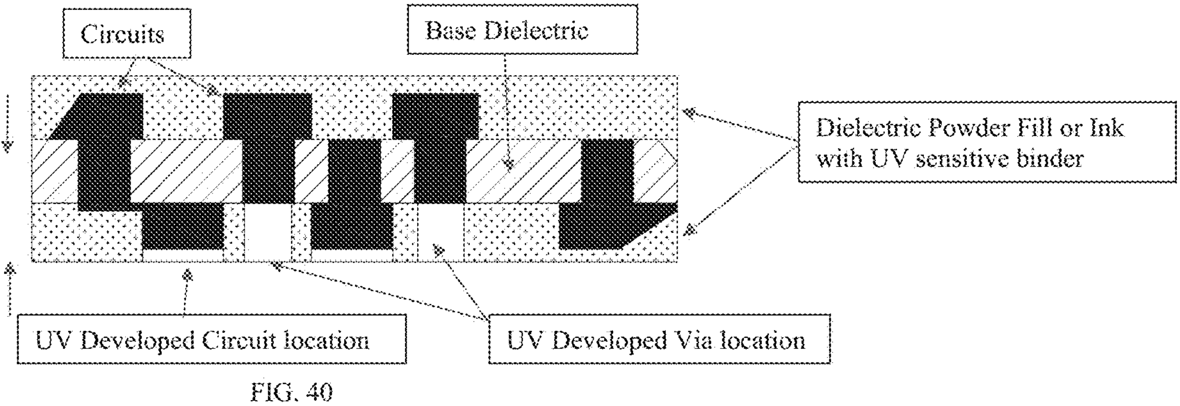
FIG. 40 shows another alternative to FIGS. 37-39.

FIG. 40 illustrates another alternative in which the process add to the mixture a phot-imageable material that allows for via-hole locations or circuit-bearing locations to be created in a photolithography process where areas exposed to UV light will cure and remain in place and areas masked from UV exposure can be developed away in further processing steps. This process can be repeated multiple times to create a multi-layer circuit stack.

It should be understood that unless stated otherwise, the different processes described herein can be combined in a single composite process that includes multiple of the processes described herein on a single circuit stack and resulting PCB.

There are many benefits to the new processes described herein such as enabling a more efficient utilization of dielectric layers within a printed circuit assembly. A main structure of the new processes is to create dielectric layers that contain one or more patterns of circuitry, and fusion bond them to a core circuit on both sides of the core, with the options of having circuits on one surface or both surfaces respectively. The dielectric layers bearing circuit patterns result in a reduction of dielectric spacing allowing for precision impedance tuning and control within a dielectric thickness that would normally dictate a wider trace which allows for circuit trace width reduction while maintaining target impedance. The new processes also allows for creating circuit bearing layers with variable circuit thickness on the same layer with a % of the circuit on the surface of the dielectric, above the surface of the dielectric, and/or below the surface of the dielectric which allows for variable impedance targets on the same layer as well as other desired functions such as thicker circuits for power delivery and management, clearance aspects for vertical solid copper layer to layer via connections, and vertical differential pairs or ganged single ended signal circuits within a smaller area than possible with surface only horizontal circuits of the same thickness. The new processes also provide a reduction or elimination of circuit embossing during lamination by providing a partial or full removal of the need for the fusion layer to conform to surface circuits which introduces stress and the potential for delamination sections with low bond strength. The new processes allow for very high layer count circuit assemblies with very high signal integrity, low signal loss and a significant improvement in circuit density within a given overall thickness and circuit size. The new processes allow for the additional of surface circuits post lamination of the circuit bearing dielectric layers with a final circuit bearing dielectric layer acting as final solder or die attach mask. The new processes provide a means and method for using an etched copper metal mask to assist with circuit target definition and via drilling with the opportunity to ablate dielectric material in a section that is smaller than the spot size of the laser beam while providing straight vertical side walls with limited residue. The benefits of the new processes are significant, as they allow for creating a customized and tune-able dielectric matrix that can be deposited directly onto exposed circuits in a precise manner with controlled dimension and thickness to achieve density and signal integrity not possible with conventional commercially available film dielectric materials. The new processes allow for mixing dielectric materials into a matrix providing customized dielectric properties on any layer or at any point within a given layer. The new processes allow for application of dielectrics in thinner or thicker sections to refine dielectric separation in dimensions not available from commercial supply base. The new processes allow for the use of phot-imageable binders to create circuit structures such as copper filled locations and photo-imaged via locations rather than laser ablation which often requires a metal stop layer to prevent the laser beam from penetrating lower layer dielectric. The new processes allow for application of high melt temperature polymers such as LCP or Teflon with a lower temperature binder such that the dielectric deposition can be processed below the melt temperature of the higher temperature materials. The new processes allow for the mixture of various dielectric materials to create a customized tunable matrix containing any number of polymer, ceramic, or various additive to alter the dielectric or mechanical properties of the resultant circuit layer or multi-layer circuit stack. The new processes allow for the dielectric matrix to be used as the primary dielectric for a given layer such that the material bonds layers to layers as well as contains the proper dielectric properties itself without a supporting base dielectric layer. The new r allows for the dielectric matrix to be used at a final layer as a solder mask rather than applying conventional solder mask which is a high loss material and difficult to register at high resolution. The invention is also very applicable to the emerging 3D printing technology where a customized dielectric bearing ink can be created with the desired dielectric properties created in a combination of polymer particles printed directly onto the circuit pattern. The invention is also capable of creating a matrix of dielectric material such as LCP combined with an epoxy type or thermos set polymer binder to create and fusable powder whereby the lower melt temperature binder flows under heat or heat and pressure to create a desired dielectric layer bonding one or more circuit layers together.

What is claimed is:

1. A method of fabricating a printed circuit board comprising:

providing a first substrate having a first dielectric layer, a first copper layer on a first side of the first dielectric layer, and a second copper layer on a second side of the first dielectric layer, wherein the second copper layer is 5 microns or less thick;

disposing a first resist on the second copper layer;

selectively removing the first resist to expose the second copper layer at first circuit locations, while leaving the first resist in areas outside of the first circuit locations;

chemically etching to remove the second copper layer that is exposed by the first resist, thereby exposing the first dielectric layer at the first circuit locations;

laser ablating to form recesses in the first dielectric layer that is exposed by the second copper layer, thereby forming recesses in the first dielectric layer at the first circuit locations; and disposing copper in the recesses to form first circuit traces that are at least partially embedded in the first dielectric layer;

providing a second substrate having a second dielectric layer, a third copper layer on a first side of the second dielectric layer, and a fourth copper layer on a second side of the second dielectric layer, wherein the fourth copper layer is 5 microns or less thick;

disposing a second resist on the fourth copper layer;

selectively removing the second resist to expose the fourth copper layer at second circuit locations, while leaving the second resist in areas outside of the second circuit locations;

chemically etching to remove the fourth copper layer that is exposed by the second resist, thereby exposing the second dielectric layer at the second circuit locations;

laser ablating to form recesses in the second dielectric layer that is exposed by the fourth copper layer, thereby forming recesses in the second dielectric layer at the second circuit locations;

disposing copper in the recesses of the second dielectric layer to form second circuit traces that are at least partially embedded in the second dielectric layer;

laminating the first substrate to a first side of a core with a first fusion layer disposed between the first substrate and the first side of the core; and laminating the second substate to a second side of the core with a second fusion layer disposed between the second substrate and the second side of the core.

2. The method of claim 1, wherein the first dielectric layer is 100 microns or less thick.

3. The method of claim 1, wherein the first dielectric layer is one of polyimide, FR4, or liquid crystal polymer (LCP).

4. The method of claim 1, wherein disposing copper in the recesses in the first dielectric layer to form first circuit traces includes electrolessly plating the recesses in the first dielectric layer and then electrolytically plating the recesses in the first dielectric layer.

5. The method of claim 1, comprising:

removing the first resist remaining on the second layer of copper after disposing copper in the recesses in the first dielectric layer; and after removing the first resist remaining on the second layer of copper after disposing copper in the recesses in the first dielectric layer, removing the second layer of copper in areas outside of the first circuit locations.

6. The method of claim 1, comprising:

removing the first resist remaining on the second layer of copper after laser ablating and prior to disposing copper in the recesses in the first dielectric layer;

after disposing copper in the recesses in the first dielectric layer, removing the second layer of copper in areas outside of the first circuit locations.

7. The method of claim 1, wherein laminating the first substrate to the first side of the core includes laminating such that the first side of the first dielectric layer faces the core, wherein laminating the second substrate to the second side of the core includes laminating such that the first side of the second dielectric layer faces the core.

8. The method of claim 1, wherein laminating the first substrate to the first side of the core includes laminating such that the second side of the first dielectric layer faces the core, wherein laminating the second substrate to the second side of the core includes laminating such that the second side of the second dielectric layer faces the core.

9. The method of claim 1, comprising:

after laminating the first substrate to the first side of the core, laser ablating to form a first via hole through the first dielectric layer in the first substrate and the first fusion layer to the first side of the core;

after laminating the second substrate to the second side of the core, laser ablating to form a second via hole through the second dielectric layer in the second substrate and the second fusion layer to the second side of the core;

placing resist on the exposed first circuit traces and second circuit traces; and after placing resist on the exposed first circuit traces, plating the first via hole and the second via hole to form an electrical connection between the first substrate and the second substrate through the core.

10. The method of claim 9, comprising:

removing the second copper layer in areas outside of the first circuit locations;

removing the fourth copper layer in areas outside of the second circuit locations, wherein removing the second copper layer in areas outside of the first circuit locations occurs after laser ablating to form a first via hole through the first dielectric layer in the first substrate and the first fusion layer to the first side of the core, wherein removing the fourth copper layer in areas outside of the second circuit locations occurs after laser ablating to form a second via hole through the second dielectric layer in the second substrate and the second fusion layer to the second side of the core.

11. The method of claim 1, comprising:

disposing a third resist on the first copper layer wherein the first copper layer is 5 microns or less thick;

selectively removing the third resist to expose the first copper layer at third circuit locations, while leaving the third resist in areas outside of the third circuit locations;

chemically etching to remove the first copper layer that is exposed by the third resist, thereby exposing the first dielectric layer at the third circuit locations;

laser ablating to form second recesses in the first dielectric layer that is exposed by the first copper layer, thereby forming the second recesses in the first dielectric layer at the third circuit locations; and disposing copper in the second recesses of the first dielectric layer to form third circuit traces that are at least partially embedded in the first dielectric layer.

12. The method of claim 11, wherein the third circuit traces are disposed opposite areas of the first dielectric layer in which no first circuit traces are present.

13. A method of fabricating a printed circuit board comprising:

providing a first substrate having a first dielectric layer, a first copper layer on a first side of the first dielectric layer, and a second copper layer on a second side of the first dielectric layer, wherein the second copper layer is 5 microns or less thick;

disposing a first resist on the second copper layer;

selectively removing the first resist to expose the second copper layer at first circuit locations, while leaving the first resist in areas outside of the first circuit locations;

chemically etching to remove the second copper layer that is exposed by the first resist, thereby exposing the first dielectric layer at the first circuit locations;

laser ablating to form recesses in the first dielectric layer that is exposed by the second copper layer, thereby forming recesses in the first dielectric layer at the first circuit locations; and disposing copper in the recesses to form first circuit traces that are at least partially embedded in the first dielectric layer;

providing a second substrate having a second dielectric layer, a third copper layer on a first side of the second dielectric layer, and a fourth copper layer on a second side of the second dielectric layer, wherein the fourth copper layer is 5 microns or less thick;

disposing a second resist on the fourth copper layer;

selectively removing the second resist to expose the fourth copper layer at second circuit locations, while leaving the second resist in areas outside of the second circuit locations;

chemically etching to remove the fourth copper layer that is exposed by the second resist, thereby exposing the second dielectric layer at the second circuit locations;

laser ablating to form recesses in the second dielectric layer that is exposed by the fourth copper layer, thereby forming recesses in the second dielectric layer at the second circuit locations;

disposing copper in the recesses of the second dielectric layer to form second circuit traces that are at least partially embedded in the second dielectric layer; and laminating the second substrate to the first substrate with a fusion layer therebetween such that the second side of the first dielectric layer of the first substrate faces the second side of the second dielectric layer of the second substrate.

14. The method of claim 13, wherein the first circuit traces include a first trace that extends parallel to, is the same length as, and is disposed opposite of a second trace included in the second circuit traces.

15. The method of claim 13, comprising:

after laminating the second substrate to the first substrate, laser ablating to form a via hole through the first dielectric layer in the first substrate and the fusion layer between the first substrate and the second substrate and expose a portion of the second circuit traces in the second substrate; and plating the via hole to form an electrical connection between the portion of the second circuit traces and the first side of the first dielectric layer of the first substrate.

16. The method of claim 13, comprising:

after laminating the second substrate to the first substrate, laser ablating to form a via hole through the first dielectric layer in the first substrate, the fusion layer between the first substrate and the second substrate, and the second dielectric layer in the second substrate; and plating the via hole to form an electrical connection between the first side of the first dielectric layer of the first substrate and the first side of the second dielectric layer of the second substrate.

17. The method of claim 13, wherein the first dielectric layer is 100 microns or less thick.

18. The method of claim 13, wherein the first dielectric layer is one of polyimide, FR4, or liquid crystal polymer (LCP).

19. The method of claim 13, wherein disposing copper in the recesses in the first dielectric layer to form first circuit traces includes electrolessly plating the recesses in the first dielectric layer and then electrolytically plating the recesses in the first dielectric layer.

20. The method of claim 13, comprising:

removing the first resist remaining on the second layer of copper after disposing copper in the recesses in the first dielectric layer; and after removing the first resist remaining on the second layer of copper after disposing copper in the recesses in the first dielectric layer, removing the second layer of copper in areas outside of the first circuit locations.

21. The method of claim 13, comprising:

removing the first resist remaining on the second layer of copper after laser ablating and prior to disposing copper in the recesses in the first dielectric layer;

after disposing copper in the recesses in the first dielectric layer, removing the second layer of copper in areas outside of the first circuit locations.

22. The method of claim 13, comprising:

disposing a third resist on the first copper layer wherein the first copper layer is 5 microns or less thick;

selectively removing the third resist to expose the first copper layer at third circuit locations, while leaving the third resist in areas outside of the third circuit locations;

chemically etching to remove the first copper layer that is exposed by the third resist, thereby exposing the first dielectric layer at the third circuit locations;

laser ablating to form second recesses in the first dielectric layer that is exposed by the first copper layer, thereby forming the second recesses in the first dielectric layer at the third circuit locations; and disposing copper in the second recesses of the first dielectric layer to form third circuit traces that are at least partially embedded in the first dielectric layer.

23. The method of claim 22, wherein the third circuit traces are disposed opposite areas of the first dielectric layer in which no first circuit traces are present.

* * * * *